(12) United States Patent
Hellge et al.

(10) Patent No.: US 9,473,174 B2
(45) Date of Patent: Oct. 18, 2016

(54) INTERLEAVING FOR LAYER-AWARE FORWARD ERROR CORRECTION

(71) Applicant: Fraunhofer-Gesellschaft zur Foerderung der angewandten Forschung e.V., Munich (DE)

(72) Inventors: Cornelius Hellge, Berlin (DE); Thomas Schierl, Berlin (DE); Thomas Wiegand, Berlin (DE); David Gómez-Barquero, Cartagena (ES)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 130 days.

(21) Appl. No.: 14/277,925

(22) Filed: May 15, 2014

(65) Prior Publication Data
US 2014/0250344 A1 Sep. 4, 2014

Related U.S. Application Data

(63) Continuation of application No. PCT/EP2012/073261, filed on Nov. 21, 2012.

(60) Provisional application No. 61/562,093, filed on Nov. 21, 2011.

(51) Int. Cl.
*H03M 13/00* (2006.01)
*H03M 13/11* (2006.01)
(Continued)

(52) U.S. Cl.
CPC ......... *H03M 13/1105* (2013.01); *H03M 13/27* (2013.01); *H04L 1/007* (2013.01); *H04L 1/0071* (2013.01); *H04L 1/0041* (2013.01); *H04L 1/0057* (2013.01); *H04L 1/0072* (2013.01)

(58) Field of Classification Search
CPC ..... H03M 13/11; H03M 13/27; H04L 1/007; H04L 1/0057; H04L 1/0041; H04L 1/0071; H04L 1/0072

USPC ................. 714/752, 755, 758, 776
See application file for complete search history.

(56) References Cited

U.S. PATENT DOCUMENTS

| 2008/0013620 A1 | 1/2008 | Hannuksela et al. |
| 2008/0172593 A1* | 7/2008 | Rainish .................. H04N 19/89 714/776 |

(Continued)

FOREIGN PATENT DOCUMENTS

| EP | 1 324 527 A1 | 7/2003 |
| JP | 2000-244429 A | 9/2000 |

(Continued)

OTHER PUBLICATIONS

Shokrollahi, A., "Raptor Codes", IEEE Transactions on Information Theory, vol. 52, No. 6, Jun. 2006, pp. 2551-2567.
(Continued)

*Primary Examiner* — Esaw Abraham
*Assistant Examiner* — Osman M Alshack
(74) *Attorney, Agent, or Firm* — Keating & Bennett, LLP

(57) ABSTRACT

An error correcting encoder includes an error correcting data generator for receiving payload data belonging to a first category, for receiving payload data belonging to a second category, for determining first error correcting data for the first category payload data, and for determining second error correcting data for the second category payload data. The error correcting encoder further includes an interleaver for interleaving at least the second error correcting data and the second category payload data with each other. A first interleaving length relative to an interleaving of the first error correcting data and the first category payload data differs from a second interleaving length relative to the interleaving of the second error correcting data and the second category payload data. A corresponding error correcting decoder and methods for error correcting encoding/decoding are also disclosed. According to alternative embodiments, a payload interleaving length is different from an error correcting data interleaving length.

25 Claims, 28 Drawing Sheets

(51) Int. Cl.
*H03M 13/27* (2006.01)
*H04L 1/00* (2006.01)

(56) References Cited

U.S. PATENT DOCUMENTS

| | | | |
|---|---|---|---|
| 2010/0017686 A1 | 1/2010 | Luby et al. | |
| 2010/0111197 A1 | 5/2010 | Jiang et al. | |
| 2010/0146363 A1* | 6/2010 | Birru | H04L 1/0043 714/752 |
| 2012/0131407 A1* | 5/2012 | Chiao | H03M 13/356 714/751 |
| 2012/0219089 A1* | 8/2012 | Murakami | H04L 25/0222 375/296 |
| 2012/0236115 A1* | 9/2012 | Zhang | H04N 19/597 348/43 |
| 2013/0188014 A1* | 7/2013 | Won | H04N 13/0059 348/43 |
| 2013/0208777 A1 | 8/2013 | Yu et al. | |
| 2013/0308505 A1* | 11/2013 | Hong | H04B 7/0413 370/310 |

FOREIGN PATENT DOCUMENTS

| | | |
|---|---|---|
| JP | 2003-304510 A | 10/2003 |
| KR | 10-1999-0038141 A | 6/1999 |
| KR | 10-2009-0037920 A | 4/2009 |
| KR | 10-2010-0017587 A | 2/2010 |
| WO | 2010/053932 A1 | 5/2010 |

OTHER PUBLICATIONS

Luby, M. et al., "RaptorQ Forward Error Correction Scheme for Object Delivery" Internet Engineering Task Force, Reliable Multicast Transport, Internet-Draft, Aug. 24, 2010, 68 pages.
Luby, M. et al., "Raptor Forward Error Correction Scheme for Object Delivery", Internet Engineering Task Force, Network Working Group, Request for Comments: 5053, Oct. 2007, 46 pages.
Camarillo, G. et al., "The Session Description Protocol (SDP) Grouping Framework", Internet Engineering Task Force, Request for Comments: 5888, Jun. 2010, 21 pages.
Schulzrinne, H. et al., "RTP: A Transport Protocol for Real-Time Applications", Internet Engineering Task Force, STD 0064, Network Working Group, Request for Comments: 3550, Jul. 2003, 104 pages.
Postel, J., "User Datagram Protocol", Internet Engineering Task Force, STD 6, Request for Comments: 768, Aug. 28, 1980, 3 pages.
Wenger, S. et al., "RTP Payload Format for Scalable Video Coding", Internet Engineering Task Force, Audio/Video Transport, Request for Comments: 6190, May 2011, 100 pages.
Wang, Y. et al., "RTP Payload Format for MVC Video" Internet Engineering Task Force, Audio/Video Transport Payloads WG, Internet Draft, Sep. 7, 2011, 27 pages.
Handley, M. et al., "SDP: Session Description Protocol", Internet Engineering Task Force, Network Working Group, Request for Comments: 4566, Jul. 2006, 49 pages.
Schierl, T. et al., "Signaling Media Decoding Dependency in the Session Description Protocol (SDP)", Internet Engineering Task Force, Network Working Group, Request for Comments: 5583, Jul. 2009, 18 pages.
Watson, M. et al., "Forward Error Correction (FEC) Framework", Internet Engineering Task Force, Request for Comments: 6363, Oct. 2011, 42 pages.
Watson, M., et al., "Raptor FEC Schemes for FECFRAME", Internet Engineering Task Force, Forward Error Correction Framework, Internet Draft, Sep. 18, 2011, 21 pages.
Watson, M. et al., "RTP Payload Format for Raptor FEC", Internet Engineering Task Force, Forward Error Correction Framework Working Group, Internet Draft, Oct. 10, 2011, 22 pages.
Begen, A., "Session Description Protocol Elements for the Forward Error Correction (FEC) Framework", Internet Engineering Task Force, Request for Comments: 6364, Oct. 2011, 18 pages.
Begen, A., "Forward Error Correction Grouping Semantics in the Session Description Protocol", Internet Engineering Task Force, Request for Comments: 5956, Sep. 2010, 14 pages.
Official Communication issued in International Patent Application No. PCT/EP2012/073261, mailed on Feb. 25, 2013.
Gómez-Barquero et al., "Base Band inter-frame FEC (BB-iFEC) for Next Generation Handheld DVB-NGH", IEEE International Symposium on Broadband Multimedia Systems and Broadcasting, Jun. 8, 2011, 6 pages.
Hellge et al., "Layer-Award forward Error Correction for Mobile Broadcast of Layered Media", IEEE Transaction on Multimedia, vol. 13, No. 3, Jun. 1, 2011, pp. 551-562.
Hellge, C. et al., "Mobile TV Using Scalable Video Coding and Layer-Aware Forward Error Correction", IEEE International Conference, Multimedia and Expo, Apr. 26, 2008, pp. 1177-1180.
Hellge, C. et al., "Receiver Driven Layered Multicast with Layer-Aware Forward Error Correction", 15th IEEE International Conference, Image Processing, Oct. 15, 2008, pp. 2304-2307.
Sun, Y. et al., "Layer-Aware Unequal Error Protection for Robust Scalable H.264 Video Transmission Over Packet Lossy Networks", 14th International Conference, Network-Based Information Systems (NBiS), Sep. 9, 2011, pp. 628-633.
Huo, Y. et al., "Tree-Structured Multiple Description Coding for Multiview Mobile TV and Camera-Phone Networks", IEEE, Vehicular Technology Conference, Sep. 8, 2011, 8 pages.
Official Communication issued in corresponding Japanese Patent Application No. 2014-542814, mailed on Jul. 28, 2015.
English Translation of Official Communication issued in corresponding Korean Patent Application No. 10-2014-7017176, mailed on Nov. 9, 2015.
Hellge et al., "Mobile TV with Long Time Interleaving and Fast Zapping", IEEE International Conference on Multimedia and Expo Workshops, Jul. 13, 2012, pp. 623-628.

* cited by examiner

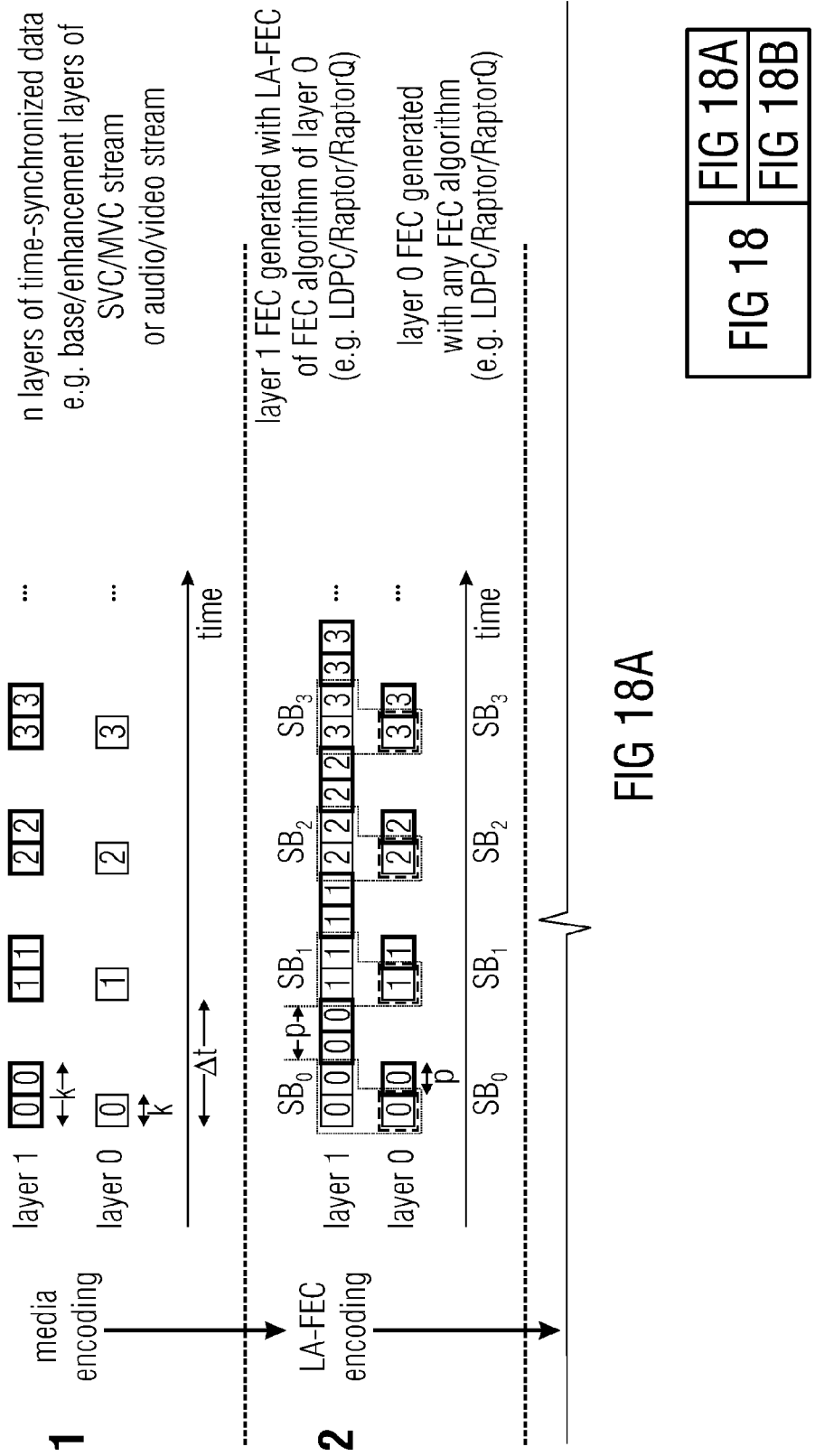

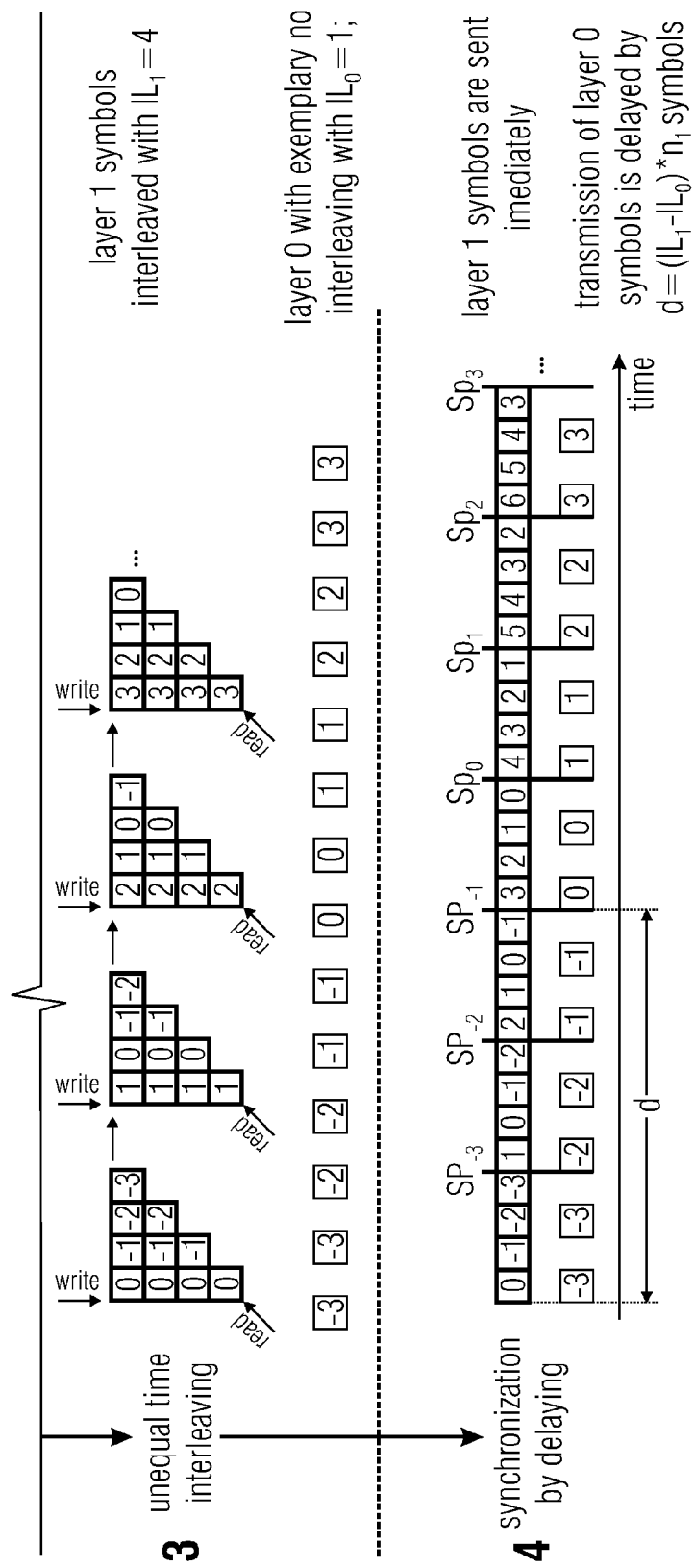

INTERLEAVING FOR LAYER-AWARE FORWARD ERROR CORRECTION

CROSS-REFERENCE TO RELATED APPLICATIONS

This application is a continuation of copending International Application No. PCT/EP2012/073261, filed Nov. 21, 2012, which is incorporated herein by reference in its entirety, and additionally claims priority from U.S. Application No. 61/562,093, filed Nov. 21, 2011, which is also incorporated herein by reference in its entirety.

BACKGROUND OF THE INVENTION

The present invention relates to an error correcting data generator, an error correcting decoder, a method for error correcting encoding, a method for error correcting decoding, and corresponding computer readable digital storage media.

First, an overview of the so called LA-FEC (Layer Aware Forward Error Correction) approach will be given. The content has been already published in [5] and [18]. SVC (Scalable Video Coding) employs different temporal and inter-layer predictions for achieving coding efficiency which introduces dependencies between portions of the SVC video stream. FIG. 1 shows an exemplary coding structure, with a base layer and one enhancement layer, which increases the temporal and the spatial resolution of the base layer. Furthermore, FIG. 1 schematically illustrates the dependencies within temporal-spatial scalability due to hierarchical prediction structure and inter layer prediction. The arrows in FIG. 1 denote the dependencies between the different access units.

In SVC, the base layer is more important than the enhancement layer. In case of missing base layer information, the enhancement layer information typically becomes useless due to missing prediction information.

Therefore, a differentiation in robustness is in general beneficial for the transmission of SVC, where the base layer gets a stronger protection than the enhancement layers.

SUMMARY

According to an embodiment, an error correcting encoder may have: an error correcting data generator for receiving payload data belonging to a first category (first category payload data), for receiving payload data belonging to a second category, for determining first error correcting data for the first category payload data, and for determining second error correcting data for the second category payload data; and an interleaver for interleaving at least the second error correcting data and the second category payload data with each other, wherein a first interleaving length relative to an interleaving of the first error correcting data and the first category payload data is different from a second interleaving length relative to the interleaving of the second error correcting data and the second category payload data.

According to another embodiment, an error correcting decoder may have: a de-interleaver for de-interleaving an interleaved data stream including second category payload data and second error correcting data; and an error corrector for receiving first category payload data, first error correcting data, the second category payload data, and the second error correcting data in an de-interleaved form from the de-interleaver, for correcting possible errors in the first category payload data using at least the first error correcting data, and for correcting possible errors in the second category payload data using at least the second error correcting data; wherein a first interleaving length relative to an interleaving of the first category payload data and the first error correcting data is different from a second interleaving length relative to the interleaving of the second category payload data and the second error correcting data.

According to another embodiment, a method for error correcting encoding may have the steps of: receiving payload data belonging to a first category; receiving payload data belonging to a second category; determining first error correcting data for the first category payload data; determining second error correcting data for the second category payload data; and interleaving at least the second error correcting data and the second category payload data with each other, wherein a first interleaving length relative to an interleaving of the first error correcting data and the first category payload data is different from a second interleaving relative to an interleaving of the second error correcting data and the second category payload data.

According to another embodiment, a method for error correcting decoding may have the steps of: receiving an interleaved data stream including second category payload data and second error correcting data; de-interleaving the interleaved data stream; receiving or obtaining first category payload data and first error correcting data; correcting possible errors in the first category payload data using at least the first error correcting data; and correcting possible errors in the second category payload data using at least the second error correcting data; wherein a first interleaving length relative to an interleaving of the first category payload data and first error correcting data is different from a second interleaving length relative to the interleaving of the second category payload data and the second error correcting data.

Another embodiment may have a computer readable digital storage medium having stored thereon a computer program having a program code for performing, when running on a computer, a method for error correcting encoding, the method having the steps of: receiving payload data belonging to a first category; receiving payload data belonging to a second category; determining first error correcting data for the first category payload data; determining second error correcting data for the second category payload data; and interleaving at least the second error correcting data and the second category payload data with each other, wherein a first interleaving length relative to an interleaving of the first error correcting data and the first category payload data is different from a second interleaving relative to an interleaving of the second error correcting data and the second category payload data.

Another embodiment may have a computer readable digital storage medium having stored thereon a computer program having a program code for performing, when running on a computer, a method for error correcting decoding, the method having the steps of: receiving an interleaved data stream including second category payload data and second error correcting data; de-interleaving the interleaved data stream; correcting possible errors in the first category payload data using at least the first error correcting data; and correcting possible errors in the second category payload data using at least the second error correcting data; wherein a first interleaving length relative to an interleaving of the first category payload data and first error correcting data is different from a second interleaving length relative to the interleaving of the second category payload data and the second error correcting data.

According to another embodiment, an error correcting encoder may have: an error correcting data generator for receiving payload data and determining error correcting data for the payload data; an interleaver for interleaving the error correcting data and the payload data, wherein the error correcting data precedes the payload data in an interleaved data stream and wherein a payload interleaving length is different from an error correcting data interleaving length.

According to another embodiment, an error correcting decoder may have: a de-interleaver for de-interleaving an interleaved data stream including payload data and error correction data for the payload data, wherein the error correcting data precedes the payload data in the interleaved data stream and wherein a payload interleaving length is different from an error correcting data interleaving length; and an error corrector for receiving the payload data and the error correcting data, and for correcting possible errors in the payload data using the error correcting data, wherein the payload is utilizable but possibly erroneous when only the payload data has been received and the error correcting data has been missed.

Embodiments provide an error correcting encoder that comprises an error correcting data generator for receiving payload data belonging to a first category (first category payload data), for receiving payload data belonging to a second category, for determining first error correcting data for the first category payload data, and for determining second error correcting data for the second category payload data. The error correcting encoder further comprises an interleaver for interleaving at least the second error correcting data and the second category payload data with each other, wherein a first interleaving length relative to an interleaving of the first error correcting data and the first category payload data is different from a second interleaving length relative to the interleaving of the second error correcting data and the second category payload data.

Further embodiments provide an error correcting decoder that comprises a de-interleaver for de-interleaving an interleaved data stream comprising second category payload data and second error correcting data. The error correcting decoder further comprises an error corrector for receiving first category payload data, first error correcting data, the second category payload data, and the second error correcting data in an de-interleaved form from the de-interleaver, for correcting possible errors in the first category payload data using at least the first error correcting data, and for correcting possible errors in the second category payload data using at least the second error correcting data. A first interleaving length relative to an interleaving of the first category payload data and the first error correcting data is different from a second interleaving length relative to the interleaving of the second category payload data and the second error correcting data.

According to further embodiments, a method for error correcting encoding comprises steps of receiving payload data belonging to a first category and receiving payload data belonging to a second category. First error correcting data is then determined for the first category payload data. Second error correcting data is determined for the second category payload data. The method further comprises interleaving at least the second error correcting data and the second category payload data with each other, wherein a first interleaving length relative to an interleaving of the first error correcting data and the first category payload data is different from a second interleaving relative to an interleaving of the second error correcting data and the second category payload data.

Further embodiments provide a method for error correcting decoding. This method comprises receiving an interleaved data stream comprising second category payload data and second error correcting data. The interleaved data stream is then de-interleaved. The method also comprises receiving or obtaining first category payload data and first error correcting data. Possible errors in the first category payload data are corrected using at least the first error correcting data, and possible errors in the second category payload data are corrected using at least the second error correcting data. A first interleaving length relative to an interleaving of the first category payload data and first error correcting data is different from a second interleaving length relative to the interleaving of the second category payload data and the second error correcting data.

Further embodiments provide computer readable digital storage media having stored thereon a computer program having program code for performing, when running on a computer, a method for error correcting encoding or decoding, or both a method for error correcting encoding and a method for error correcting decoding as described herein.

According to further embodiments provide an error correcting encoder comprises an error correcting data generator for receiving payload data and determining error correcting data for the payload data and an interleaver for interleaving the error correcting data and the payload data. The error correcting data precedes the payload data in an interleaved data stream and wherein a payload interleaving length is different from an error correcting data interleaving length.

Further embodiments provide an error correcting decoder which comprises a de-interleaver for de-interleaving an interleaved data stream comprising payload data and error correction data for the payload data. The error correcting data precedes the payload data in the interleaved data stream. A payload interleaving length is different from an error correcting data interleaving length. The error correcting decoder further comprises an error corrector for receiving the payload data and the error correcting data, and for correcting possible errors in the payload data using the error correcting data. The payload is utilizable but possibly erroneous when only the payload data has been received and the error correcting data has been missed.

BRIEF DESCRIPTION OF THE DRAWINGS

Embodiments of the present invention will be detailed subsequently referring to the appended drawings, in which:

FIG. 18 schematically illustrates a transmitter side process, and includes FIGS. 18A and 18B.

DETAILED DESCRIPTION OF THE INVENTION

It is noted that during the description of the figures, elements occurring in several of these Figures are indicated with the same reference sign in each of these Figures and a repeated description of these elements as far as the functionality is concerned is avoided in order to avoid unnecessitated repetitions. Nevertheless, the functionalities and descriptions provided with respect to one figure shall also apply to other Figures unless the opposite is explicitly indicated.

Figure 1:
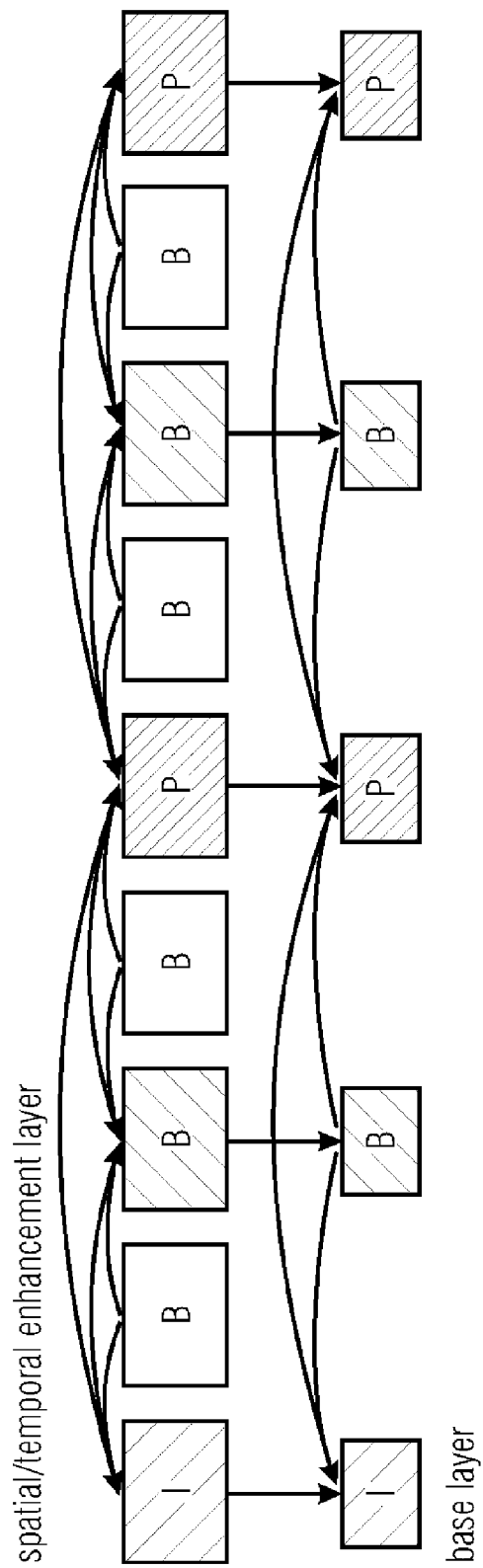
FIG. 1 schematically illustrates dependencies within temporal-spatial scalability due to hierarchical prediction structure and inter layer prediction.
Figure 2:
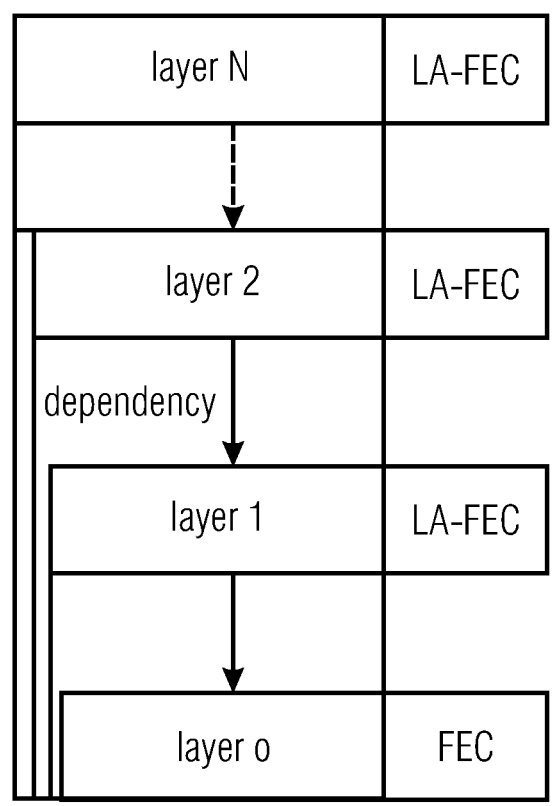
FIG. 2 shows a schematic, general approach of Layer-Aware FEC generation

Layer-Aware FEC—General Approach:

This section gives an overview on the LA-FEC approach. The basic approach of LA-FEC is shown in FIG. 2. FIG. 2 shows a possible general approach of Layer-Aware FEC generation. Redundancy of layer 0 is generated following the underlying FEC algorithm (Raptor). Redundancy of Layer 1 through Layer N is generated across all dependent layers. The basic idea of the Layer-Aware FEC (LA-FEC) approach is to extend the encoding process of the FEC algorithm across dependent video layers. The FEC processing of the base layer remains untouched, thereby still allowing the base layer to be decoded independently and preserving the correction capabilities of the original FEC algorithm. Due to the introduced connection from less important media layers within the FEC algorithm, the more important media layers are protected by additional repair data. This increases the error correction capabilities of the more important layers without adding additional repair data. The scheme in FIG. 2 illustrates the cross layer FEC generation. While the base layer ("Layer 0") FEC generation process is not changed, the FEC data of "Layer 1" is generated across source symbols of "Layer 1" and "Layer 0", FEC data of "Layer 2" is generated across "Layer 2", "Layer 1", and "Layer 0" and so on up to the FEC data of "Layer N", which is generated across the source symbols of "Layer N" and all dependent media layers. As a generic FEC approach, LA-FEC can be integrated at any OSI layer (physical, link, or application layer), and applied to FEC codes such as LDPC, Raptor, as well as RaptorQ, by simply extending the encoding process of the media enhancement layers over all dependent media layers.

Figure 3:
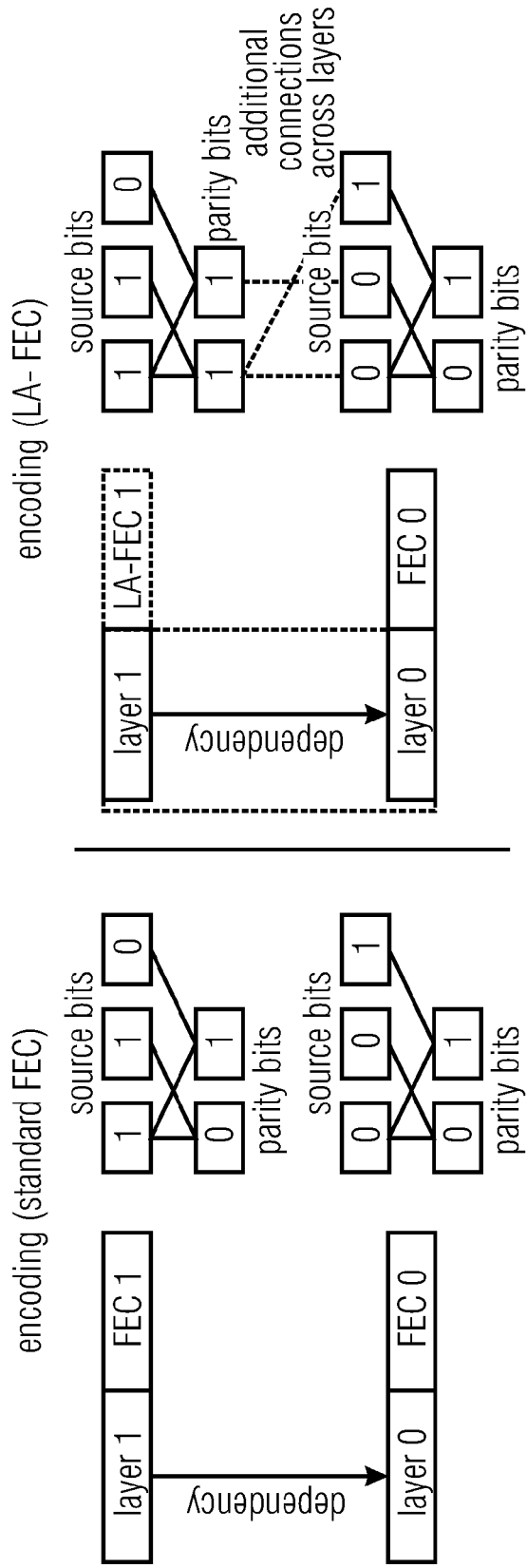
FIG. 3 schematically illustrates the encoding for standard and LA-FEC
Figure 4:
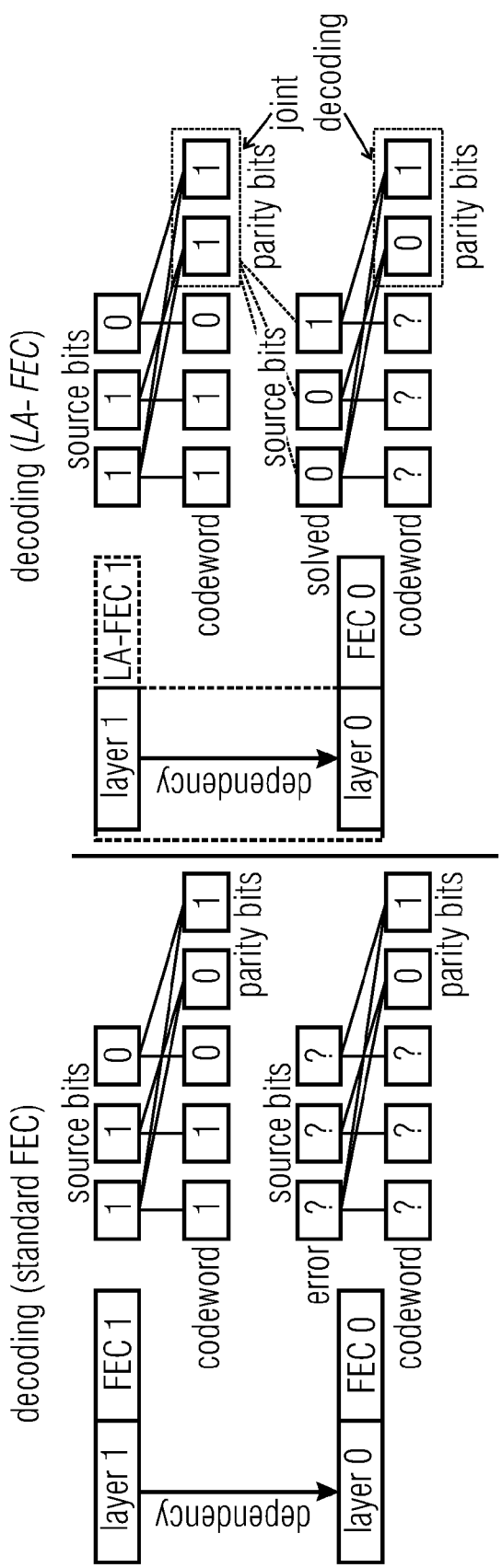
FIG. 4 schematically illustrates the decoding of standard FEC and LA-FEC

To illustrate the principle of the LA-FEC approach, FIG. 3 and FIG. 4 compare the encoding and decoding process of a standard FEC and the LA-FEC (modifications are marked by dashed lines) using a simple parity check code for one source block. In the example an erasure channel is assumed. Two quality layers are FEC coded, where Layer 1 depends on Layer 0 due to inter-layer prediction within the media stream (e.g. SVC). There are three source bits k0/1=3 and two parity p0/1=2 bits for each layer l=0,1.

For encoding (FIG. 3), the parity bits are computed by a simple XORing process of the source bits. Using a standard FEC, the XORing process is only applied within the current layer, whereas using LA-FEC, the XORing process is extended across layers following existing dependencies. Hence the parity bits of Layer 1 are generated over the source bits of both layers, Layer 0 and Layer 1, and can further be used for error correction of both layers together with the parity bits of Layer 0. The source and parity bits are combined to a codeword and transmitted over an error prone channel.

In the outlined decoding example (FIG. 4), there are three transmission errors within the codeword of Layer 0 marked by "?" and there are no errors in Layer 1. Note that the outlined example assumes an erasure channel, e.g. a binary erasure channel (BEC) or a Gilbert-Elliot channel, where bits or packets are received either correct or in an unknown state (marked in the figure with '?'). Such a channel model is used for simulating transmission errors at the Link or Application layer, where preceding methods implemented at lower ISO/OSI layers, e.g. at the physical layer, constitute error correction or error detection (e.g. by LDPC codes or/and cyclic redundancy check (CRC)). FEC codes on physical layer typically work with LLR values derived from the demodulation process, whereas FEC codes on link or application layer FEC works with erasures aka lot packets. Packets that cannot be corrected at the physical layer are typically marked as erroneous and forwarded to the higher layers (e.g. link or application layer). That is why FEC codes implemented at link or application layer do not necessitate implementing means for error detection. However, it is important to note here that the given example is shown on the application or link layer just for sake of simplicity and that the proposed methods within this description can also be applied on physical layer like shown in the LDPC description in Section "LA-FEC on physical channel with LDPC code", which works on error channel (e.g. AWGN) and necessitates means for error detection. Using a standard FEC, there are not enough parity bits within Layer 0. Therefore it cannot be corrected. Although Layer 1 is successfully received, it cannot be used due to the missing dependencies in Layer 0. Using the LA-FEC, the parity bits of Layer 1 can be used together with the parity bits of Layer 0 for correcting Layer 0. In the given example, only with LA-FEC both layers can be corrected. In summary, FIG. 4 schematically illustrates the decoding of standard and LA-FEC. Using LA-FEC, the parity bits of both layers can be used for a combined decoding.

The improvement in base layer protection comes at the expense of a reduced protection of the enhancement layer. With LA-FEC, the enhancement layer cannot be corrected independently of the base layer. Nevertheless, due to the existing dependencies within the SVC video stream, in such cases where the base layer is lost, typically the enhancement layer data cannot be used either. Therefore, LA-FEC does never perform worse than the standard FEC in terms of video quality.

Following the discussion in [1], the condition for decoding a layer 1 with ST-FEC and an optimal FEC algorithm is given by equation (1):

$$r_0 > k_0 \text{ and } r_1 > k_1 \quad (1)$$

Due to the enhancement layer symbols of LA-FEC also protect the base layer symbols, the condition [1] of decoding the base layer changes with LA-FEC to equation (2):

$$(r_0 \geq k_0) \cup (r_0 + r_1 \geq k_0 + k_1) \quad (2)$$

Since with LA-FEC, the enhancement layer FEC correction depends on the base layer recovery as well, the condition for recovering the enhancement layer changes with LA-FEC to equation (3):

$$(r_1 \geq k_1) \cap (r_0, r_1 \geq k_0 + k_1) \quad (3)$$

However, the enhancement layer depends on the base layer due to existing media dependencies, the enhancement layer cannot be used without base layer anyway, so that also with ST-FEC, the condition for a successful media decoding of the enhancement layer is the same as with equation (3).
Layer-Aware FEC integration into Raptor FEC:

The LA-FEC scheme can be applied on both, FEC on physical layer like LDPC codes or upper layer FECs like Raptor [1], [3]. The here considered exemplary upper layer FEC is the Raptor FEC. Note that the shown extension can be applied in a similar way to the more efficient RaptorQ FEC [2] like described in Section "Layer-Aware FEC integration into RaptorQ FEC".

Figure 5:
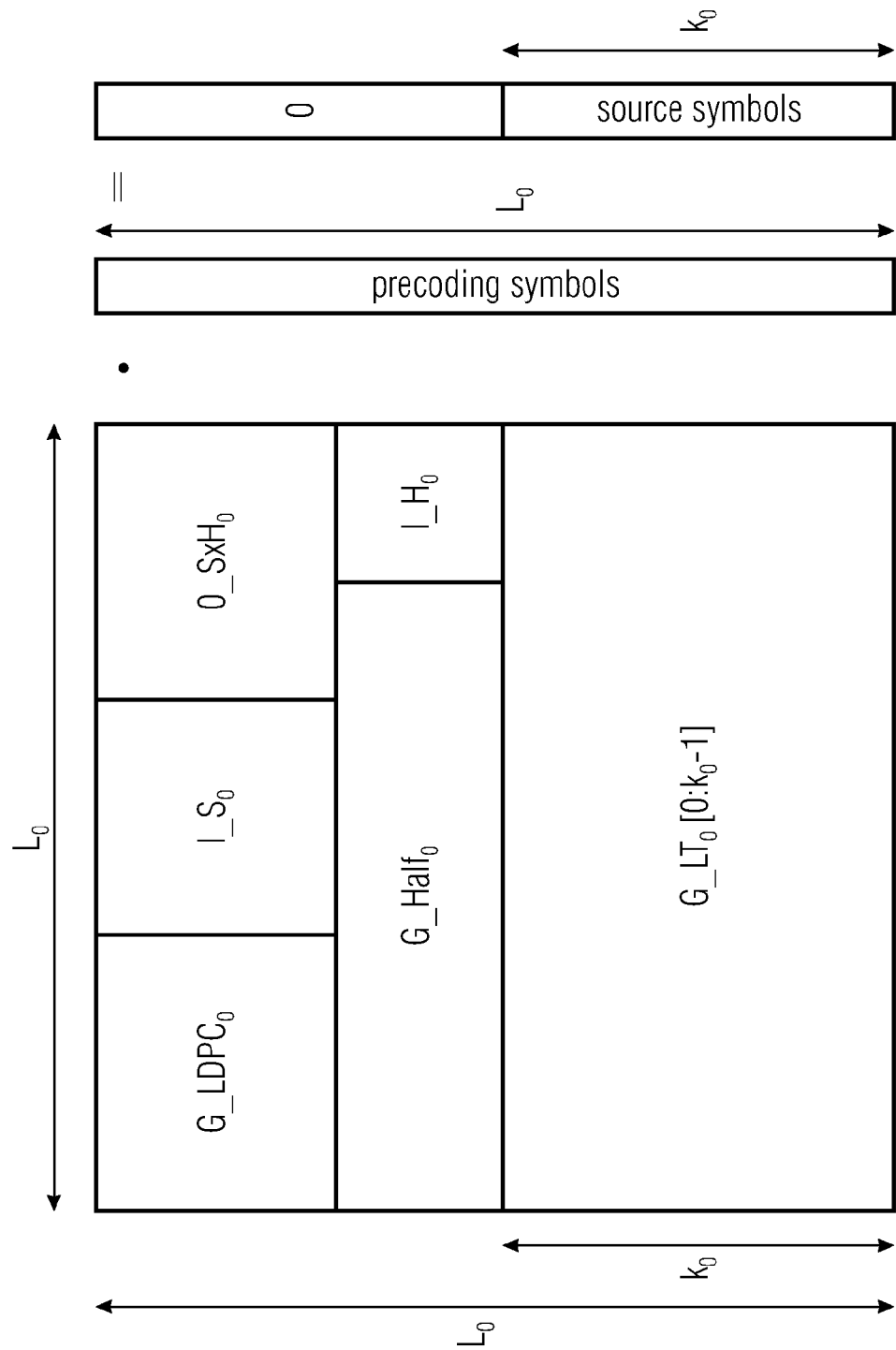
FIG. 5 shows schematically the generation of precoding symbols from source symbols by the Raptor precoding process as specified in [3].
Figure 6:
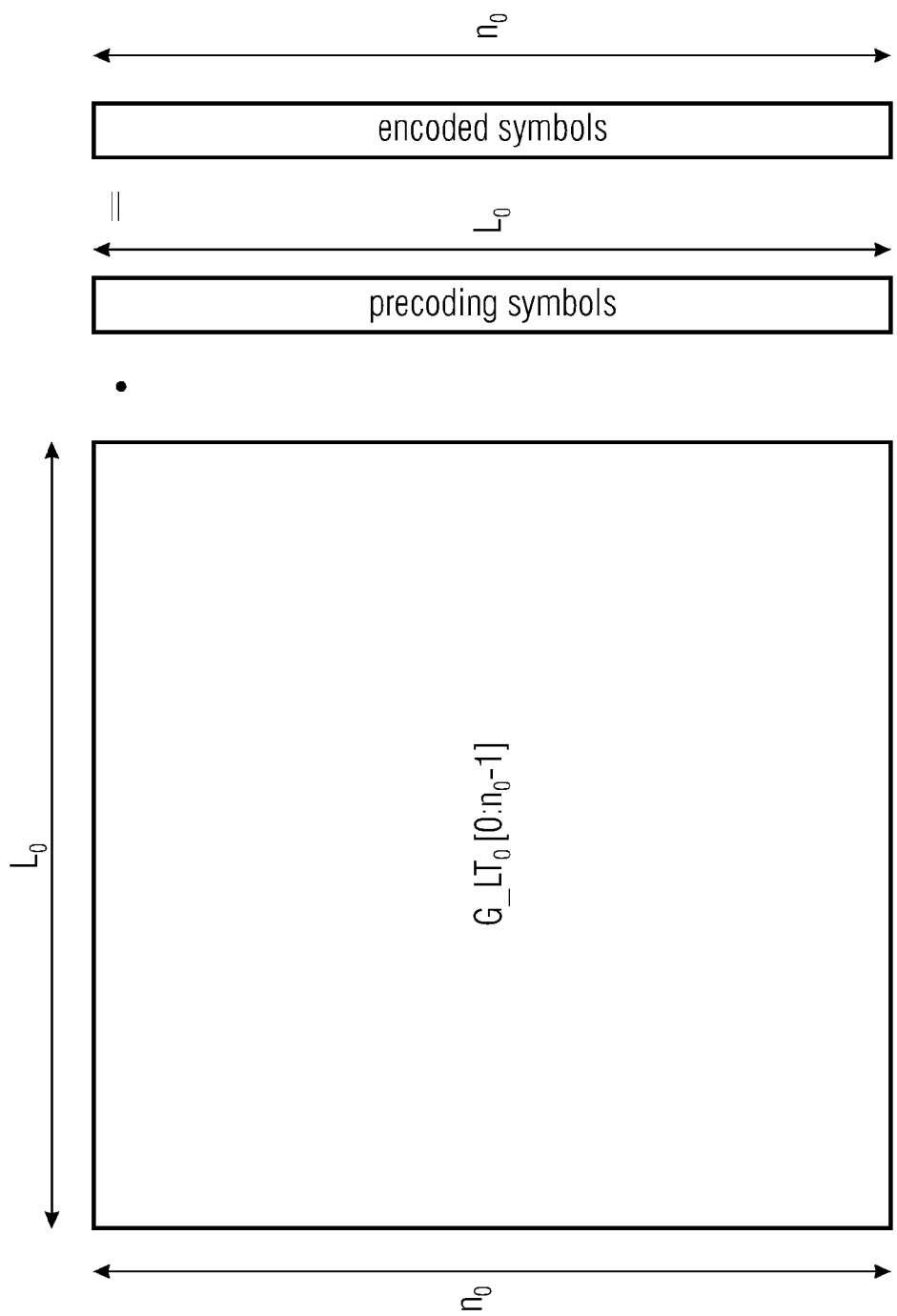
FIG. 6 shows schematically the generation of encoding symbols by LT-Coding process of Raptor code specified in [3].

Raptor codes are in general one of the first known classes of fountain code with linear time encoding and decoding. In preparation of the encoding, a certain amount of data is collected within a source block. The data of a source block is further divided in $k_0$ source symbols of a fixed symbol size. FIG. 5 and FIG. 6 illustrate the two steps of the Raptor en- and decoding process like specified in [3] for a single media "Layer 0", which consists of two encoding steps, the precode generation and the LT-code generation. FIG. 5 schematically illustrates the generation of precoding symbols from source symbols by the Raptor precoding process as specified in [3]. FIG. 6 schematically illustrates the generation of encoding symbols by LT-Coding process of Raptor code specified in [3]. Note, that the specification in [3] describes the same two-step process for encoding and decoding. In the first step, a fixed rate 'precode' step, here typically any erasure code like, e.g. LDPC, can be applied on the sources symbols to generate the so called $L_0$ precoding symbols of layer l=0. The values of the precoding symbols are determined by the matrix shown in FIG. 5, which consists of the precode matrix G_LDPC0$_0$, the identity matrix I_S$_0$, the zero matrix 0_SxH$_0$ and the LT matrix G_LT$_0$[0:k$_0$−1], where the latter is identical to the first $k_0$ rows of G_LT$_0$[0:n$_0$−1] in the second encoding process. The values within the brackets denote the number of rows. The integration of the matrix G_LT$_0$ ensures that the first $k_0$ encoding symbols after LT encoding are identical to the source symbols and the Raptor code provides a systematic codeword. After finalizing the first step, the precoding symbols are forwarded to the second step, the LT coding.

The fountain of $n_0$ encoding symbols are calculated by XORing operations of the precoding symbols following the connection given by the LT code and illustrated by the G_LT$_0$[0:n$_0$−1] matrix depicted in FIG. 6. Note, that also with LA-FEC, the generation of base layer encoding symbols follows the original Raptor process.

Figure 7:
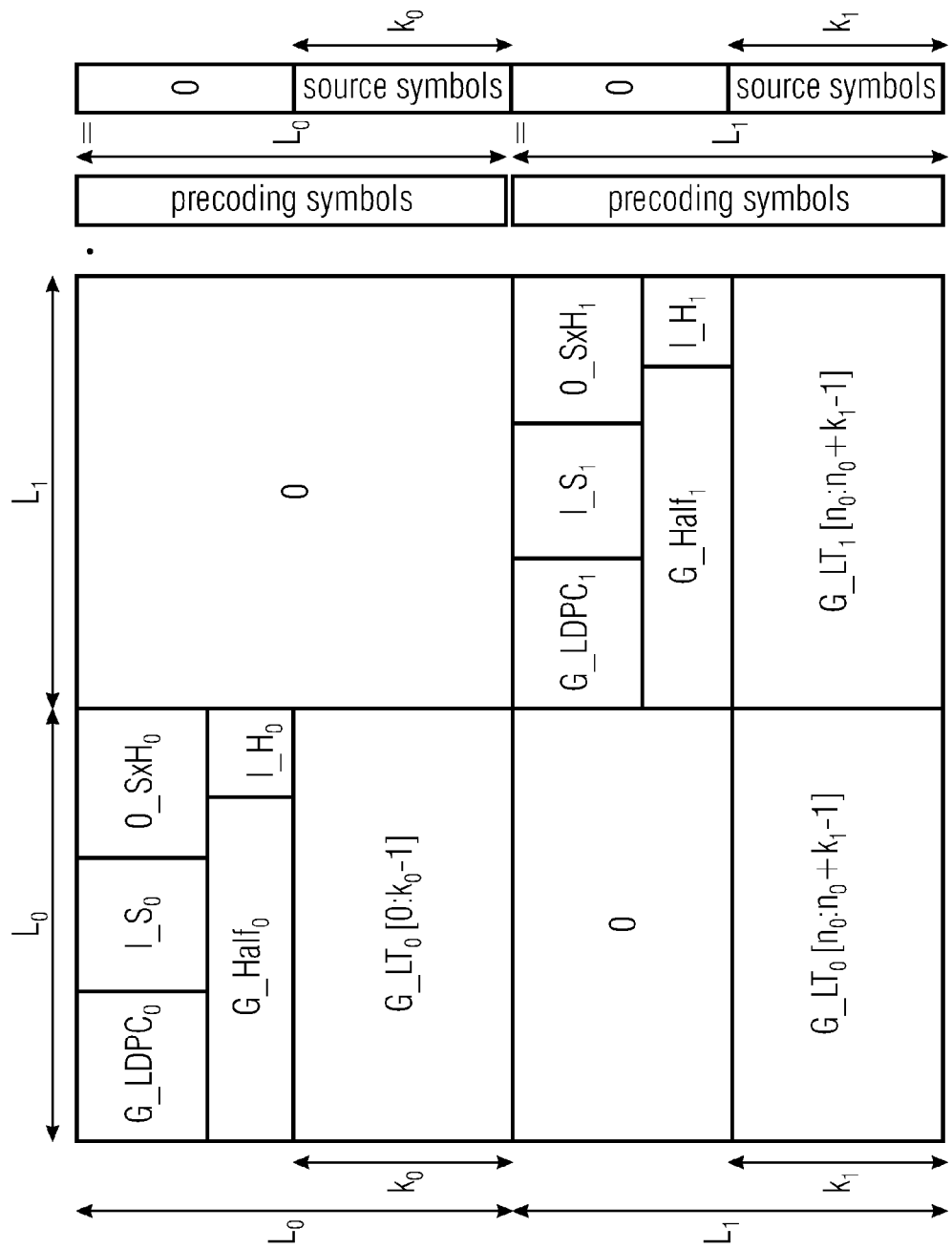
FIG. 7 shows schematically the LA-FEC Raptor precoding matrix for two layers following the specification in [1].
Figure 8:
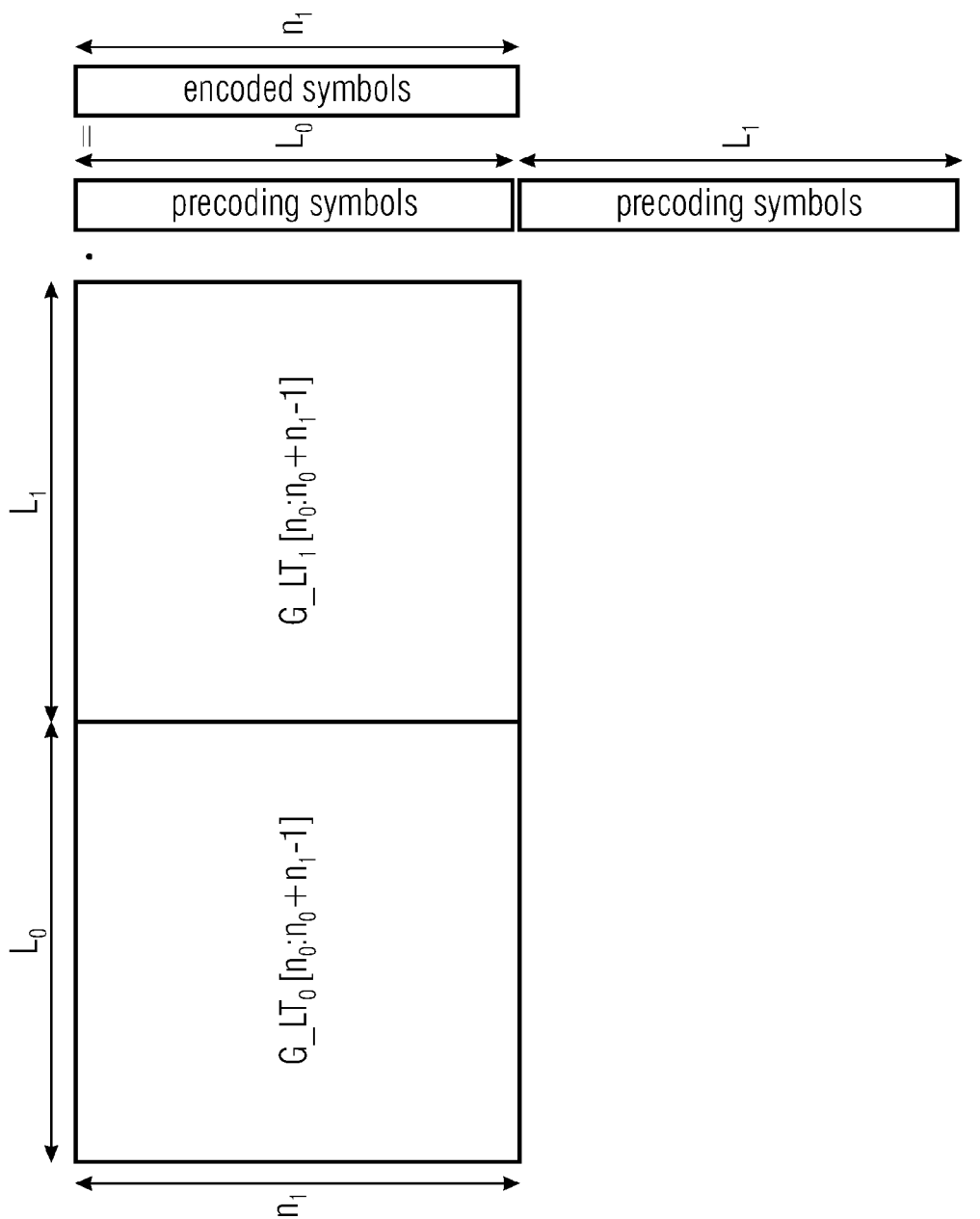
FIG. 8 schematically illustrates the LA-FEC Raptor LT-Coding process with two layers.

With a standard FEC approach, the encoded symbols of the layer 1 (enhancement layer) are generated in the same way following the process in [3]. For generation of the encoded symbols of enhancement "Layer 1" with LA-FEC, the LA-FEC approach needs to be integrated into the Raptor coding process. This necessitates on one hand the extension of the G_LT matrix of the LT-encoding step of the precoding symbols of the base layer and on the other hand the extension of the G_LT matrix of the precoding process to preserve the systematic behavior of the code. FIG. 7 and FIG. 8 show the necessitated extensions for generation of the encoded symbols of layer l=1. FIG. 7 shows schematically a LA-FEC Raptor precoding matrix for two layers following the specification in [1].

The precoding matrix of the LA-FEC Raptor is shown in FIG. 7 for two layers. The matrix consists of a concatenation of the two precoding matrices of the two layers (upper left and lower right) a zero matrix (upper right) and the LA-FEC extension from layer 1 to layer 0 (lower left). The LA-FEC extension is necessitated for keeping the code systematic. Note that the rows of G_LT$_1$ and the related extension G_LT$_0$[n$_0$:n$_0$+k$_1$−1] start at position no. The reason is on one side to increase the number of linear independent rows of layer 0 and on the other side to allow reproduction of the matrices at the receiver by the unique identifier of the encoding symbol. The encoded symbols of layer 0 are generated following the process in FIG. 8. For generation of the enhancement layer encoding symbols the precoding symbols of both layers are forwarded to the next step of the Raptor coding process described in FIG. 8.

The second step of the LA-FEC Raptor process is shown in FIG. 8 (LA-FEC LT Coding process with two layers). The generation of the encoded symbols in the second step is extended to the precoding symbols of layer 0 through extending the G_LT$_1$[n$_0$:n$_0$+n$_1$−1] matrix by G_LT$_0$[n$_0$:n$_0$+n$_1$−1]. With the additional integration of layer0 precode symbols, the encoded symbols of layer 1 can be used together with the encoding symbols of layer 0 for joint decoding like exemplarily shown above in the example in Section "Layer-Aware FEC—General approach".

The LA-FEC extensions reuse the algorithms for precode generation and LT Encoding described in [3]. In case of a successful decoded "Layer 0", the introduced connections across the layers by the LA-FEC extension are not necessitated anymore and can be removed by XORing the precoding symbols of layer 0 in the FEC process of "Layer 1". In such a case, "Layer 1" can be corrected following the standard Raptor coding process, enabling its full correction performance.

Signaling of LA-FEC:

The usage of the LA-FEC in transmission systems necessitates specific signaling and transport techniques to support the multi-layer approach in combination with LA-FEC coding. The integration of the LA-FEC Raptor extension on link or application layer is assumed to be applied for real-time transmission over RTP [6]. For real-time applications, typically RTP is used over UDP [7] due to its connectionless and non-reliable nature it allows for minimal delay in transport. RTP provides basic features such as media synchronization, transmission order recovery, multiplexing, source identification and reception feedback information. For SVC, the RTP Payload Format for Scalable Video Coding [8] is necessitated for media payload packetization and for MVC, the RTP Payload Format for Multiview Video Coding [9]. In particular, these payload formats for SVC and MVC define the transmission of the layered SVC and MVC data in multiple RTP sessions, which allows a transmission system using the LA-FEC coding process to simply differentiate between SVC layers and MVC views based on the transport address, such as an IP address, the UDP port or the synchronization source identifier in the RTP packet header (SSRC). Signaling of session related information is defined in the Session Description Protocol [10]. In order to signal the dependency of RTP sessions containing layers or views of the same codec, the SDP extensions in [11] are necessitated.

For transporting the FEC coded data, the IETF created the generic FECFRAME framework defining basic means for FEC based content delivery protocols, which can be also used in RTP. This framework defines beside other features how multiple media and repair flows are treated and further provides an identification mechanism for source symbols as a part of the payload packetization information. To use this framework with the Raptor code, [12] is intended to be used.

In order to make this framework applicable to the LA-FEC the Raptor FEC scheme [13] and the Raptor RTP Payload format [14] can be used without modifications for packetizing the repair flow. The signaling for the Raptor FEC scheme is defined in [12], where the indication of depending repair flows is already defined in RFC 6364[15], as necessitated for LA-FEC base layer protection and LA-FEC enhancement layer protection. The FEC Framework also specifies additive FEC flows, which can be jointly used for error correction like it is the case with the LA-FEC enhancement layer and base layer FEC flows. The semantics for FEC grouping of additive flows in SDP are described in RFC 5888 [17] general grouping of media elements and more specifically for the FEC Framework in RFC 5956 [16].

RFC 6364 specifies the use of SDP and describes the necessitated parameters for signaling the FEC Framework between sender and receiver. For UDP-formatted input streams, the protocol identifier is 'FEC/UDP'. The FEC Framework distinguishes between source flow and repair flow. The source IP addresses are described in the attribute 'source-filter'.

Grouping of Multiple Source and Repair Flows

The FEC Framework allows grouping of multiple source and repair flows. Such groups may be protected by a single or multiple FEC Framework instances. The association between source and repair flows can be indicated by the 'group' attribute. Details on the usage of the 'group' attribute for additive repair flows are described in RFC 5956. Following RFC 5956, all flows included in one 'group' attribute are called a FEC group. In the case there are more than one repair flows in a single 'group', these repair flows has to be additive. RFC 5888 defines 'FEC-FE' as the grouping semantics for use of the FEC Framework. Therefore, the 'a=group:FEC-FR' semantics has to be used to associate multiple flows.

A typical scenario for LA-FEC has two source flows, S1 (base layer) and S2 (enhancement layer) and two repair flows, R1 (base layer FEC) and R2 (Layer-Aware base and enhancement layer FEC). To describe such a scenario necessitates specifying two FEC groups within the SDP like shown in the following example:

a=group:FEC-FR S1 R1
a=group:FEC-FR S1 S2 R1 R2

An exemplary SDP description combining all discussed RFCs is given below (the horizontal lines indicate different sections within the SDP description).

---

```
v=0
o=Cornelius 1122334455 1122334466 IN IP4 la-fec.example.com
s=SVC LA-FEC Raptor Example
t=0 0
a=group:FEC-FR S1 S2 R1 R2
a=group:FEC-FR S1 R1
c=IN IP4 233.252.0.1/127
a=group:DDP S1 S2
```
---
```
m=video 20000 RTP/AVP 96
b=AS:90
a=framerate:15
a=rtpmap:96 H264/90000
a=fec-source-flow: id=0
a=mid:S1
```
---
```
m=video 20002 RTP/AVP 97
b=AS:64
a=framerate:15
a=rtpmap:97 H264-SVC/90000
a=fec-source-flow: id=1
a=mid:S2
a=depend:97 lay S1: 97
```
---
```
m=application 30000 RTP/AVP 110
c=IN IP4 233.252.0.3/127
a=fec-repair-flow: encoding-id=6; fssi=Kmax:8192,T:128,P:A
a=mid:R1
```
---
```
m=application 30000 RTP/AVP 111
c=IN IP4 233.252.0.4/127
a=fec-repair-flow: encoding-id=6; fssi=Kmax:8192,T:128,P:A
a=mid:R2
```
---

Figure 9A:
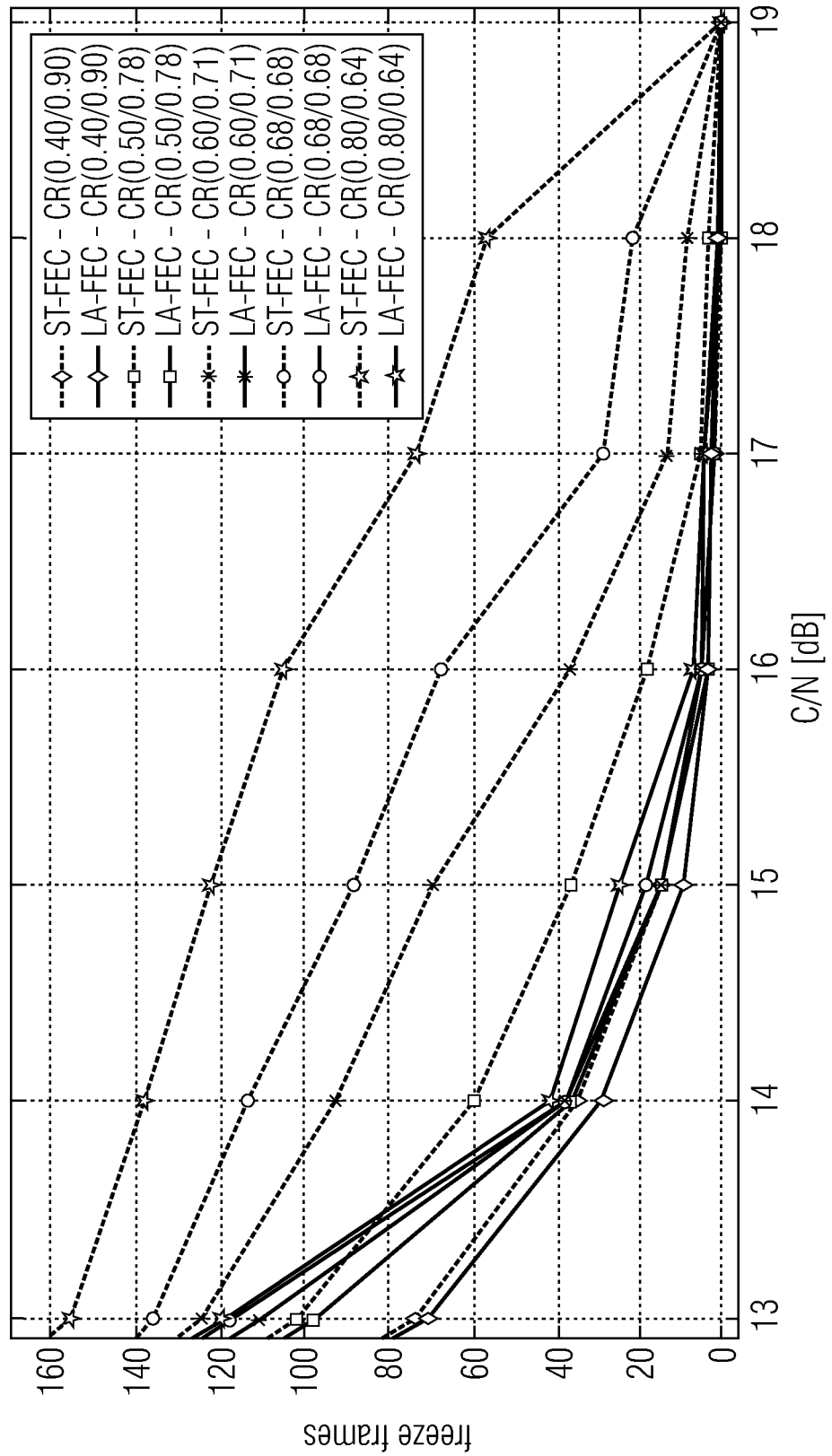
FIGS. 9A and 9B schematically show the average number of freeze frames of 250 frames (FIG. 9A) and the average PSNR value (FIG. 9B) for a VGA receiver using standard (ST)-FEC and LA-FEC with different code rate distributions across SVC layers CR (base layer/enhancement layer) at a fixed service bitrate of 1300 kbps.
Figure 9B:
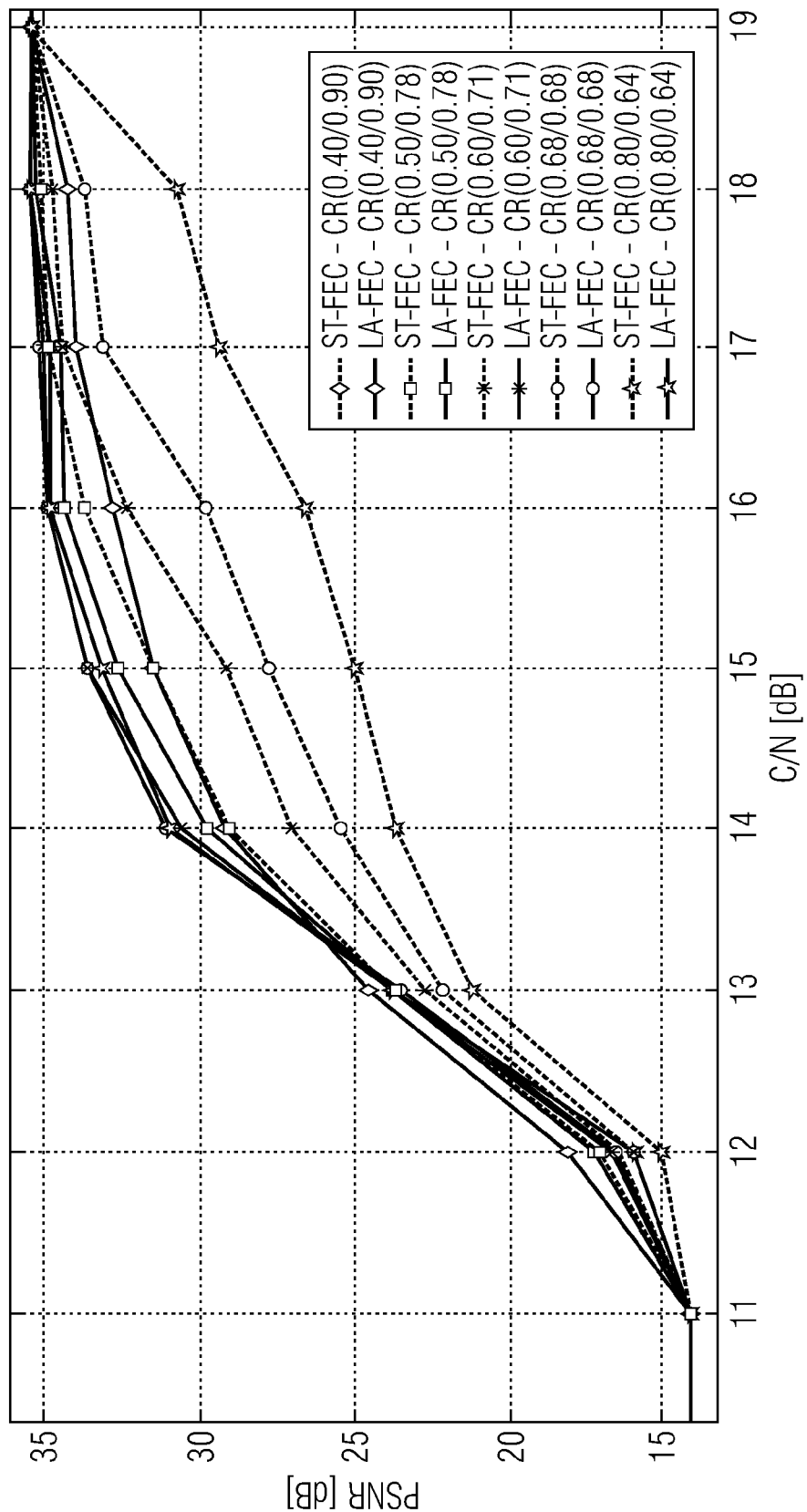

Exemplary Simulation Results in a Mobile TV Channel:

FIGS. 9A and 9B show exemplary results simulated in a Mobile TV (DVB-H) channel comparing AL-FEC implementations of standard Raptor code (ST-FEC) and Layer-Aware Raptor (LA-FEC) in DVB-H as a substitution of the existing link layer-FEC MPE-FEC. In particular, the average number of freeze frames of 250 frames (FIG. 9A) and the average PSNR value (FIG. 9B) for a VGA receiver using standard (ST)-FEC and LA-FEC with different code rate distributions across SVC layers CR (base layer/enhancement layer) at a fixed service bitrate of 1300 kbps. With ST-FEC, the FEC data is generated for each layer independently of the other layers. With LA-FEC, enhancement layer FEC data is generated across all source symbols of the base layer. These settings are simulated at different code rate distributions and a fixed total service bitrate (including audio, video, and FEC of 1300 kbps. The simulations contain a total FEC coderate of CR=0.68, with CR calculated by the ratio of source symbols $k_l$ to encoded symbols $n_l$ of layer l, CR=k/m. The CR distribution across layers is shown in the legend of the figures with the base layer code rate being the first value and the enhancement layer code rate being the second value. The upper figure shows the number of freeze frames throughout the transmission of 250 frames and the lower figure the average resulting video quality in terms of PSNR. More details on the underlying simulation conditions can be found in [1].

Like can be seen from the figures, LA-Raptor outperforms the standard Raptor scheme in terms of service continuity (lower number of freeze frames) and average video quality (higher PSNR). This comes without an increase in service bitrate just by adding the additional connections from enhancement layer to base layer in the FEC integration.

Figure 10:
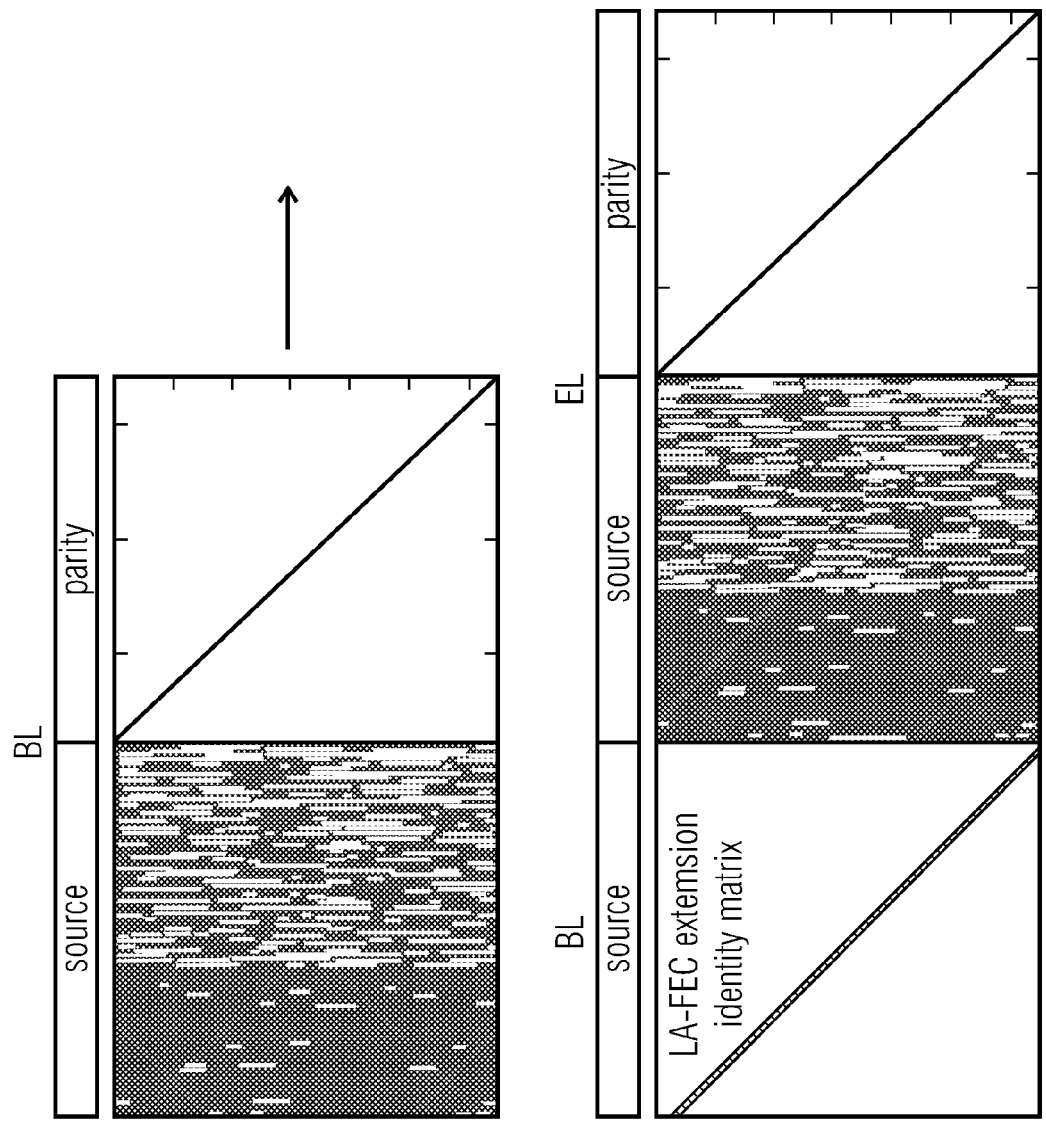
FIG. 10 schematically shows a standard LDPC matrix (top) and extended LDPC matrix (bottom).

LA-FEC on Physical Channel with LDPC Code:

This section shows how LA-FEC can be applied to a physical layer LDPC code. As an exemplary FEC code we apply the LDPC code 16 k matrix from the physical layer of DVB-S2. FIG. 10 compares the standard LDPC matrix, which is used for the base layer (BL) and the extended LA-FEC LDPC matrix used for the enhancement layer (EL) encoding. The Standard LDPC matrix is the top matrix and the extended LDPC matrix is the bottom matrix. The black points denote the position of is in the matrix whereas the white area contains zeros.

Figure 11:
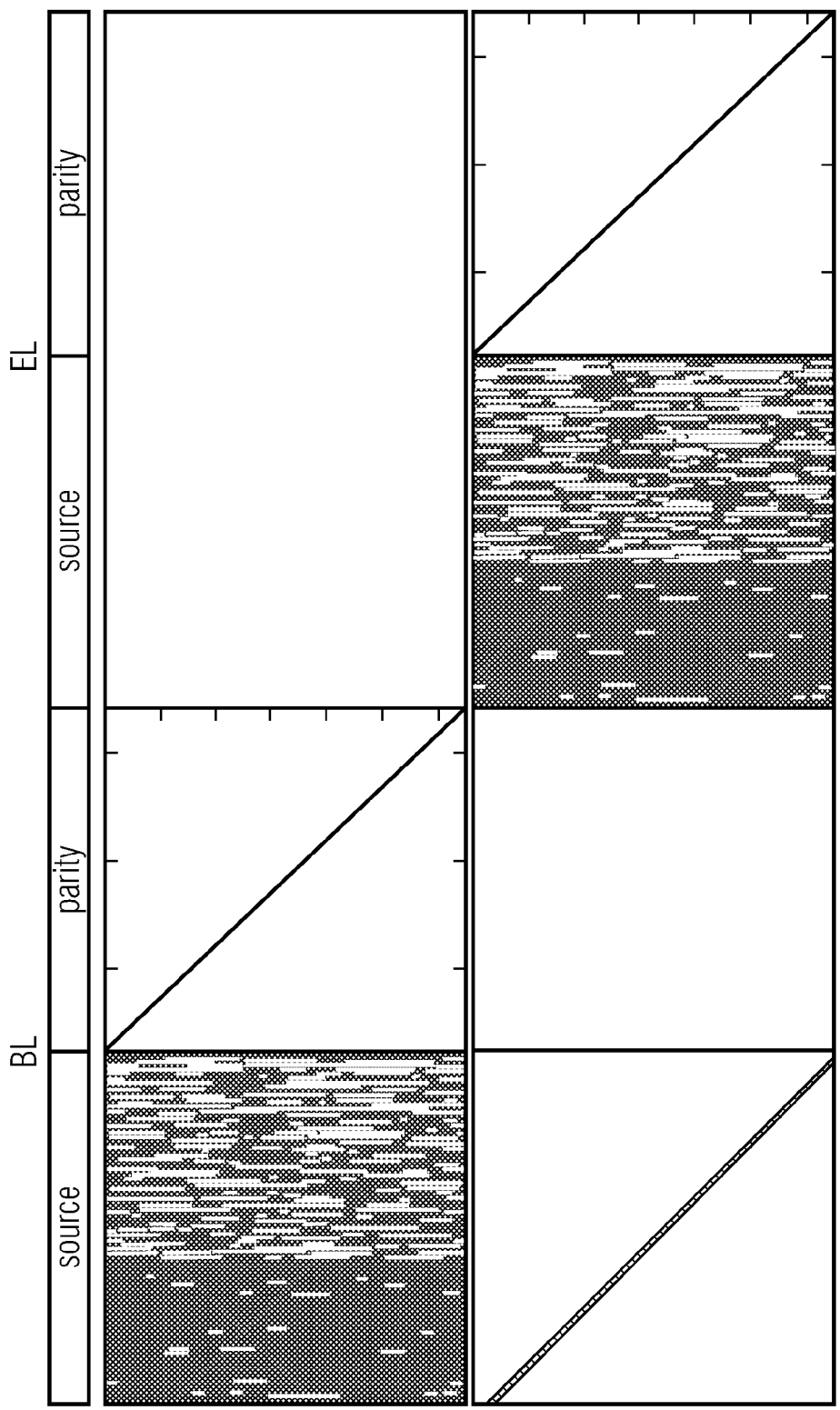
FIG. 11 schematically shows an extended LA-FEC decoding matrix

For the enhancement layer (EL) the standard LDPC matrix is extended by a simple identity matrix to the source symbols of the base layer. This only denotes an exemplary extension. One can think of a more sophisticated matrix extension. The joint decoding matrix (extended LA-FEC decoding matrix) is depicted in FIG. 11. It combines source and parity symbols of BL and EL in one decoding matrix. Any decoding algorithm for decoding LDPC codes can also be used for can be used for decoding this extended matrix.

Figure 12:
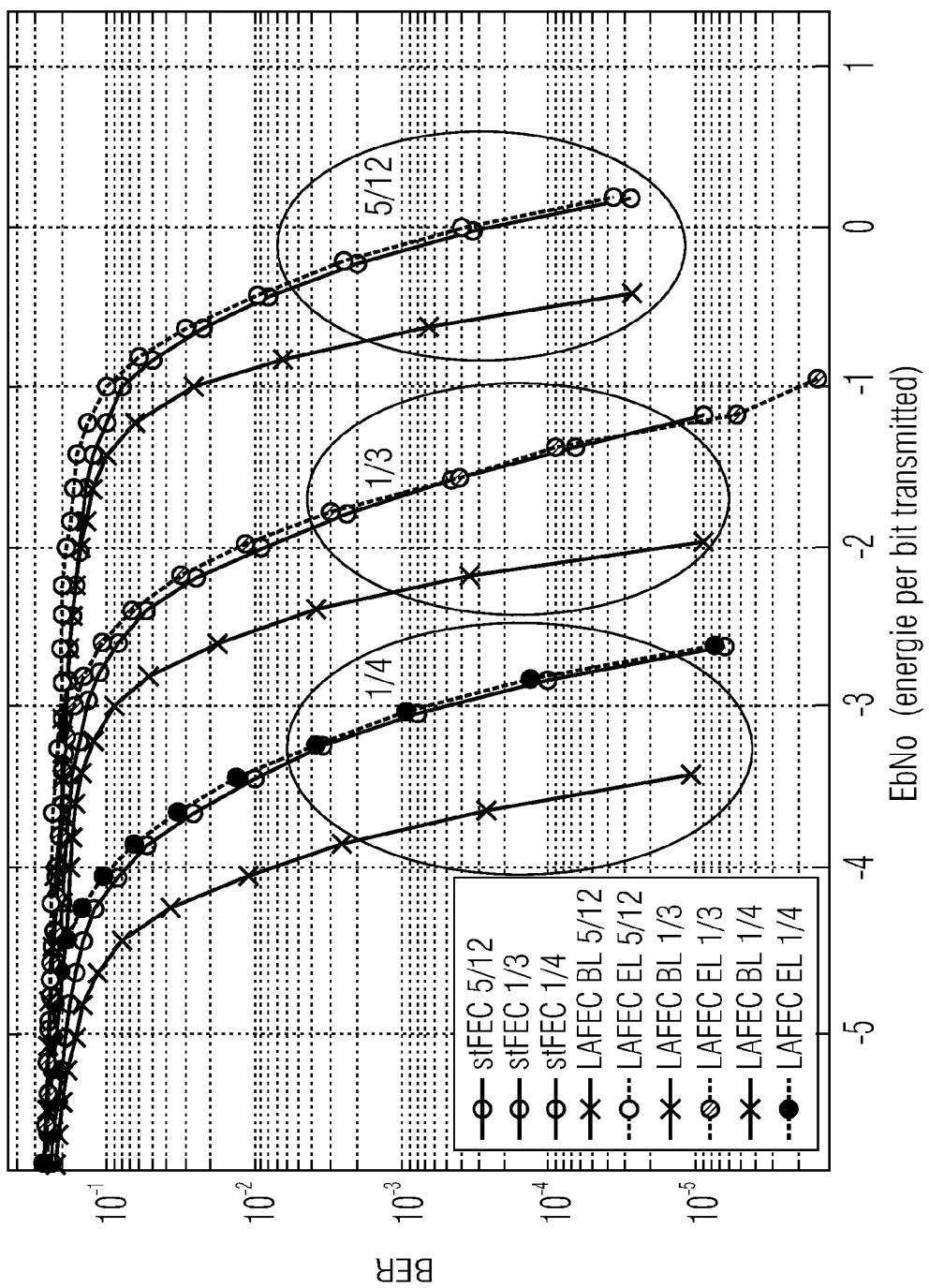
FIG. 12 shows simulation results for 16 k LA-FEC vs. 16 k St-FEC in an AWGN channel.

Some exemplary results for physical layer LDPC code are shown in FIG. 12, which shows simulation results for 16 k LA-FEC vs. 16 k St-FEC in an AWGN channel and hence compares a standard FEC (stFEC) of a 16 k LDPC code with the LA-FEC extension of a 16 k LDPC code (LA-FEC) simulated over different EbNo in a AWGN channel. QPSK is used and different code rates with equal error protection are applied. The plots show the bit error rate (BER) of the ST-FEC coding (same bitrate as BL+EL) in comparison with the base layer and enhancement layer BER curve. It can be seen that the BL performance increases, while the EL performance shows a similar performance like the ST-FEC. With a conventional unequal error protection (UEP) scheme, the enhancement layer is less protected than the base layer and the BER curves would show a decrease in enhancement layer performance. This is not the case with the LA-FEC scheme and equal error protection. However, also UEP can be applied to LA-FEC.

Time Interleaving:

Time interleaving is an important mean to increase the time diversity of a signal and thereby its robustness against burst errors. With a sufficient interleaving length, a service can overcome long error bursts. The main obstacle of typical time interleaving is the increase in service tune in time or zapping time. A long time interleaving necessitates the receiver to wait until all packets of that interleaving period have been received and filled into the deinterleaving buffer. That is, todays transmission systems try to minimize the time interleaving length although a longer interleaving length would significantly improve the service robustness.

Figure 13:
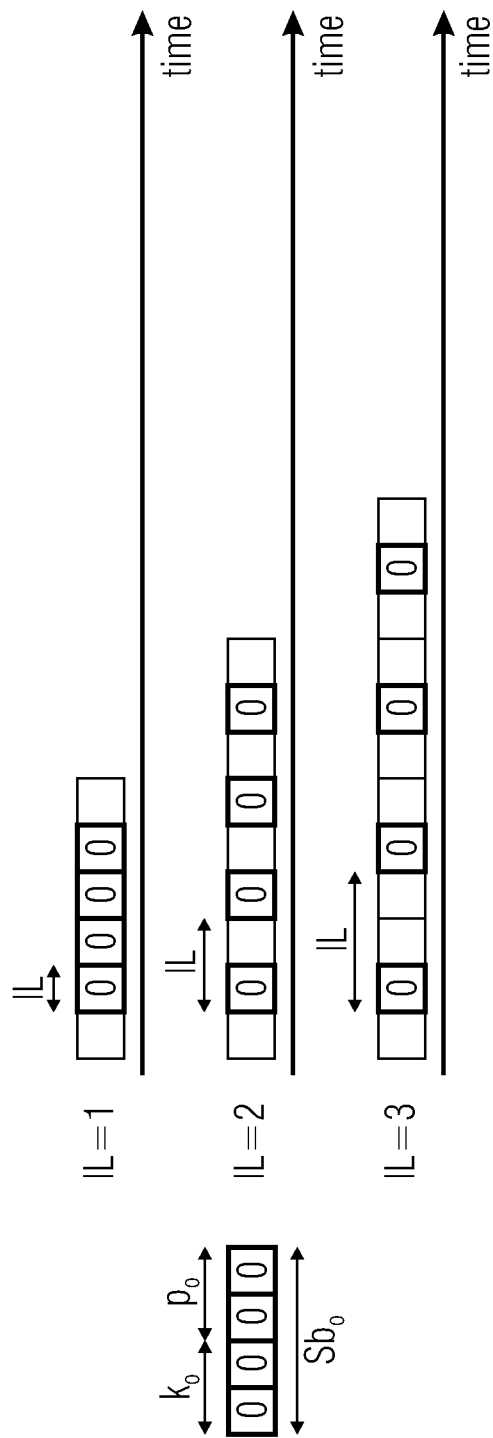
FIG. 13 schematically illustrates different interleaving length (IL) of a FEC source block 0 (SB0) with k0 source and p0 parity symbols and an increasing time diversity (IL=1,2,3)

The time diversity of a FEC source block is increased with a certain interleaving length (IL) like depicted in FIG. 13 for FEC source block 0 (SB0) with $n_0$ symbols consisting of $k_0$ source symbols and $p_0$ parity symbols and IL=(1,2,3). FIG. 13 schematically illustrates different interleaving length (IL) of a FEC source block 0 (SB0) with $k_0$ source and $p_0$ parity symbols and an increasing time diversity (IL=1,2,3).

The necessitated time to recover all symbols $n_0$=4 of a source block $SB_0$ is referred to as interleaving delay $d_{inter1}$ in terms of symbols.

Layer-Aware FEC Integration into RaptorQ FEC:

This section shows how LA-FEC can be integrated into the RaptorQ [2] FEC code. RaptorQ is an evolved version of the Raptor code (cf. Section "Layer-Aware FEC integration into Raptor FEC") that increases performance by some further optimizations.

Figure 14:
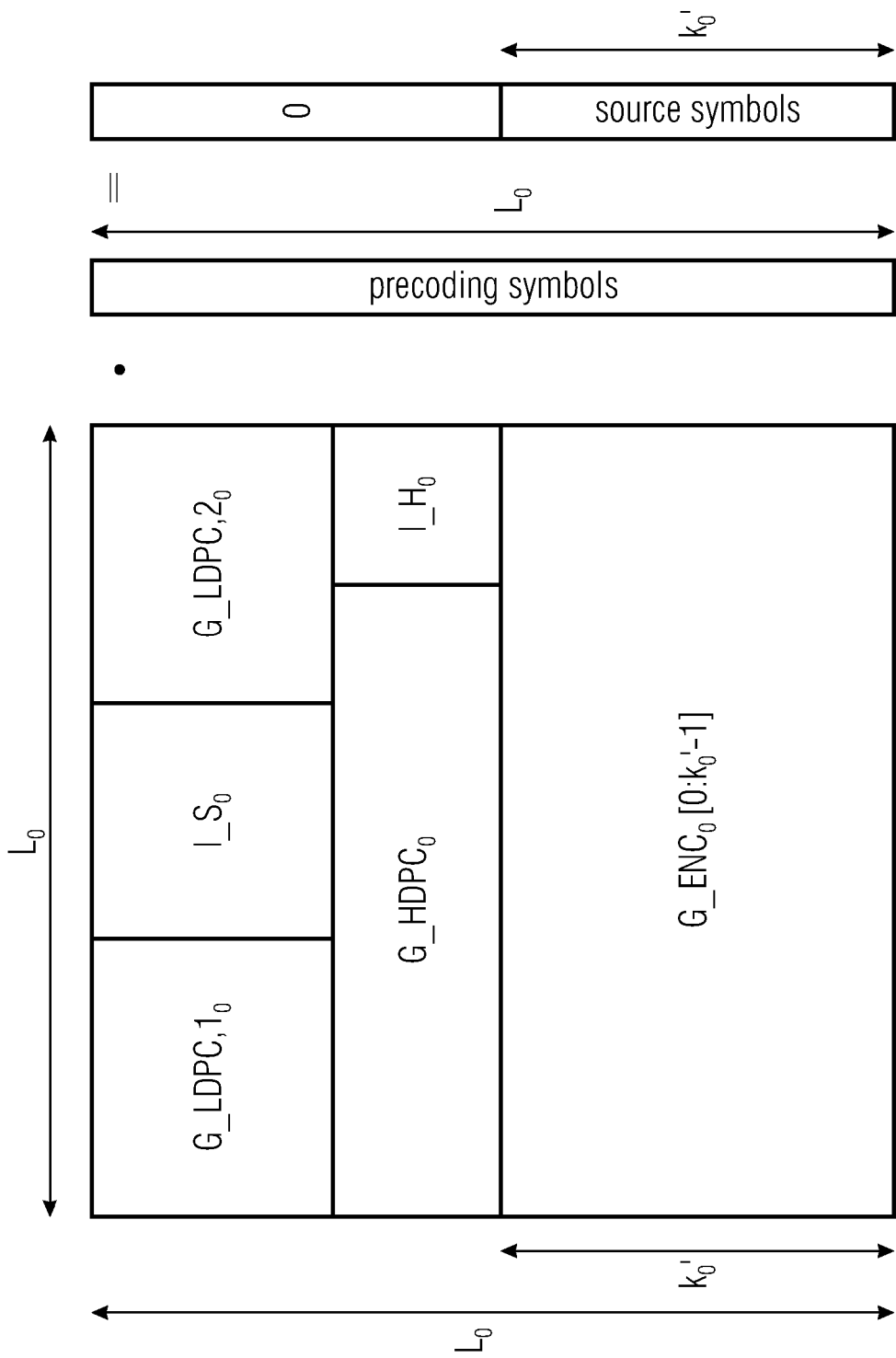
FIG. 14 schematically illustrates a precoding matrix of RaptorQ like specified in [2] used for layer 0 or single layer. Note that the same precoding matrix is used in decoding and encoding process.

The RaptorQ process is specified in [2] and consists of the same two steps for encoding and decoding like the Raptor code process (cf. Section "Layer-Aware FEC integration into Raptor FEC"). Note that the coding process is defined in a way to have the same process for encoding and decoding. The first step is the precoding process, which takes as input $k_0$ source symbols of a fixed size and generates $L_0$ precoding symbols. RaptorQ is not specified for all values of $k_0$. Therefore, the number of source symbols $k_0$ is increased by stuffing to the next available $k_0'$. The precoding matrix specified in [2] is shown in FIG. 14. FIG. 14 schematically illustrates a precoding matrix of RaptorQ like specified in [2] used for layer 0 or single layer. Note that the same precoding matrix is used in decoding and encoding process.

The precoding matrix consists of two LDPC submatrices, G_LDPC,$1_0$ and G_LDPC,$2_0$, a so called G_HDPC$_0$ matrix, two identity matrices I_S$_0$ and I_H$_0$ and the G_ENC$_0$ matrix, which contains $k_0'$ rows. While G_ENC$_0$ is necessitated to keep the code systematic, G_LDPC,$1_0$, G_LDPC,$2_0$, G_HDPC$_0$, I_S$_0$, I_H$_0$ constitute the actual precode of the RaptorQ process. More details on the generation of the submatrices can be found in [2]. Note that the whole precoding matrix is generated by the amount of source symbols $k_0$, the source symbols itself, and the symbol size T.

Figure 15:
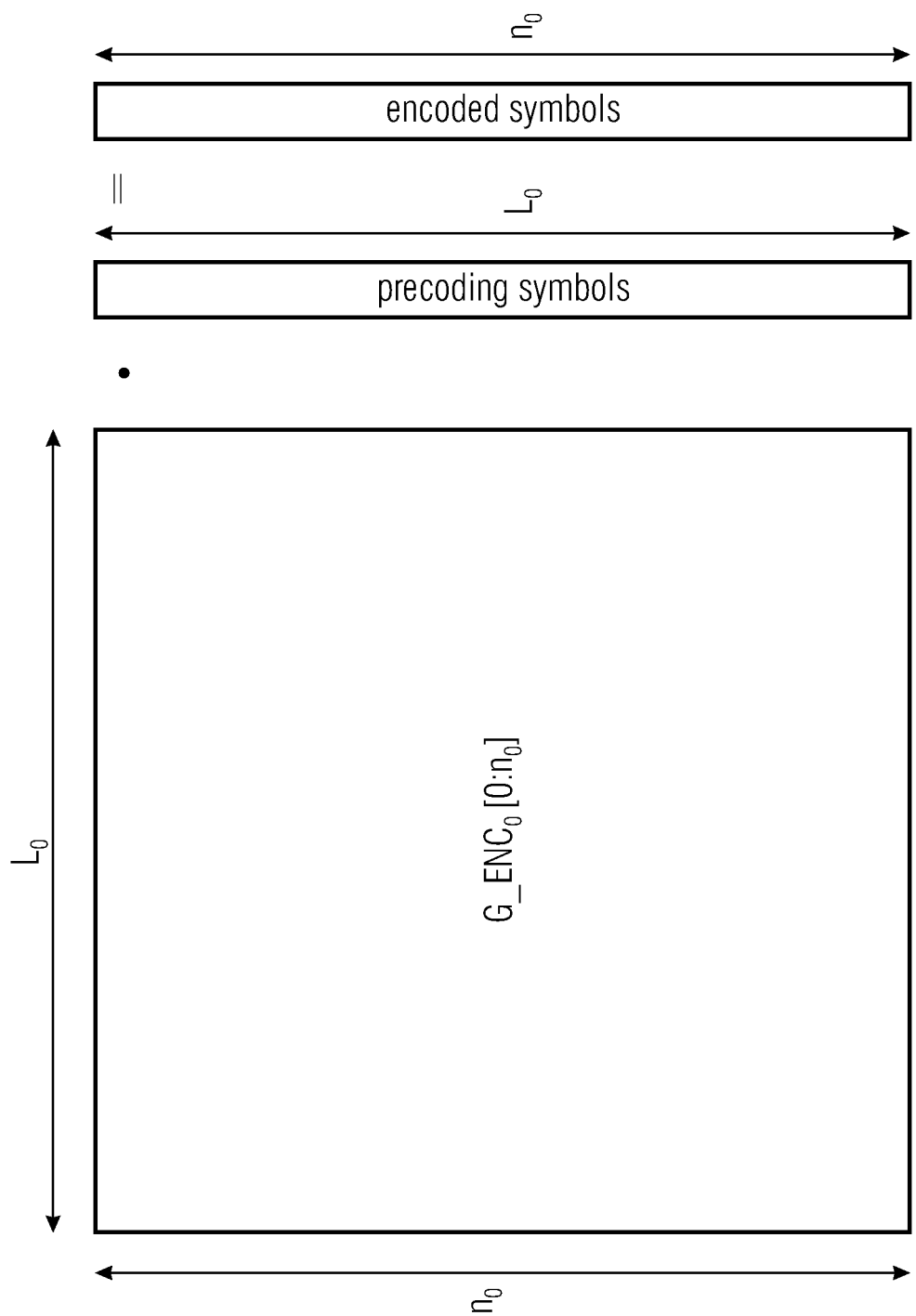
FIG. 15 schematically illustrates the LT encoding process of RaptorQ

The second step constitutes the LT encoding process of the RaptorQ which is shown in FIG. 15. FIG. 15 schematically shows the LT encoding process of RaptorQ. Note that the density distribution within matrix G_ENC$_0$ is different to the G_LT$_0$ matrix of the Raptor process (cf. Section "Layer-Aware FEC integration into Raptor FEC"). The second step takes the $L_0$ precoding symbols from the first step and generated the $n_0$ encoding symbols by XORing different sets of precoding symbols. The sets are specified by the G_ENC$_0$ matrix, which is a sparse matrix and consists of '0' and '1'. '1' denotes, that the related precoding symbols is included in the XORing process of the related encoding symbol.

Figure 16:
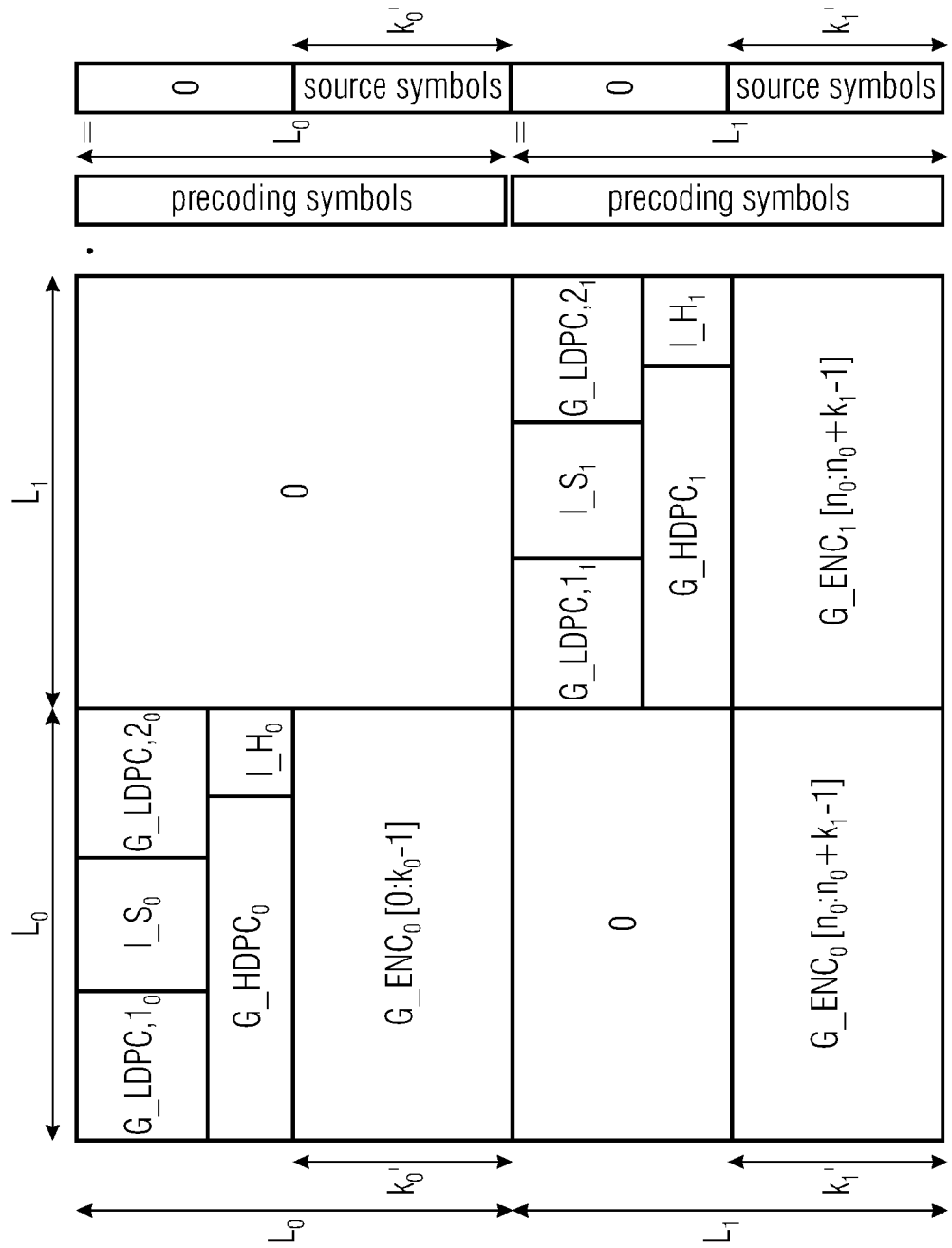
FIG. 16 schematically illustrates the precoding process of LA-FEC RaptorQ with two layers.

The precoding matrix of the LA-FEC RaptorQ is shown in FIG. 16 for two layers, i.e., FIG. 16 schematically shows the precoding process of LA-FEC RaptorQ with two layers. The matrix consists of a concatenation of the two precoding matrices of the two layers (upper left and lower right) a zero matrix (upper right) and the LA-FEC extension from layer 1 to layer 0 (lower left). The LA-FEC extension is necessitated for keeping the code systematic. Note that the rows of G_ENC$_1$ and the related extension G_ENC$_0$[$n_0$:$n_0$+$k_1$−1] start at position $n_0$. The reason is on one side to increase the number of linear independent rows of layer 0 and on the other side to allow reproduction of the matrices at the receiver by the unique identifier of the encoding symbol.

Figure 17:
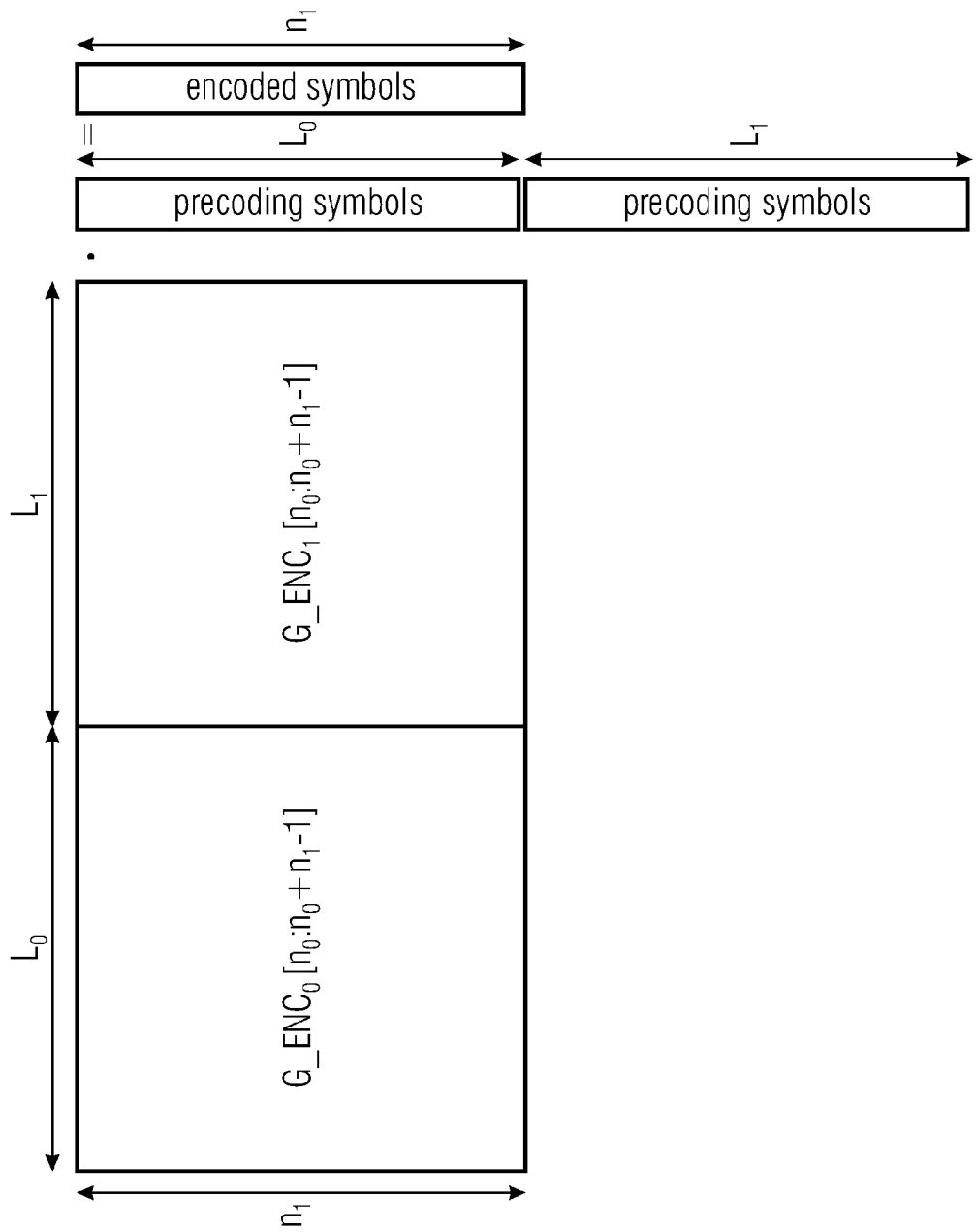
FIG. 17 schematically illustrates a second step of LA-FEC RaptorQ coding process with two layers and extended matrix to precoding symbols of layer 0.

The encoded symbols of layer 0 are generated following the process in FIG. 15. For generation of the enhancement layer encoding symbols the precoding symbols of both layers are forwarded to the next step of the RaptorQ coding process described in FIG. 17. FIG. 17 schematically illustrates the second step of LA-FEC RaptorQ coding process with two layers and extended matrix to precoding symbols of layer 0.

The encoding symbols $n_1$ of layer 1 are generated by an extended coding process taking into account the precoding symbols of layer 0 and the related coding matrix $G\_ENC_0$. Due to the first $k_1$ rows of the extended $G\_ENC=[G\_ENC_0\ G\_ENC_1]$ matrix are contained in the precoding step, the resulting encoded symbols are systematic. It should be noted that the decoding process involves the same steps but with replacing the source symbols by the received symbols and the encoded symbols by the source symbols.

LA-FEC with Unequal Time Interleaving (LA-FEC UI):

The combination of Layer-Aware FEC and layered media like SVC and MVC enables a new way of service provisioning that marries fast zapping and longtime interleaving. Embodiments relate in particular to the LA-FEC with unequal time interleaving described in this section and the following sections.

The fast zapping is given with a lower quality base layer and a short time interleaving with low robustness against burst errors but low delay. Long time interleaving is provided by the SVC enhancement layer with stronger robustness against burst losses but longer delay. However, due to the enhancement layer is FEC coded with Layer-Aware FEC across the base layer, the base layer also benefits from the improved time diversity of the enhancement layer.

This scheme is in the following referred to as Unequal time interleaving with LA-FEC or LA-FEC UI. It is important to note that LA-FEC UI can not only be applied to SVC or any other kind of layered media, but also to any kind of time synchronized data. E.g. a possible application would also be to have an audio stream with short time interleaving and a video stream what provides long time interleaving which are connected by LA-FEC. FIG. 18 illustrates the process of LA-FEC UI (i.e., a method for error correcting encoding according to the teachings disclosed herein) and gives an illustrative example. In other words, FIG. 18 schematically illustrates the transmitter side: Process of LA-FEC with unequal time interleaving with LA-FEC encoding, Unequal time interleaving, and delaying the packets of the shorter interleaving for synchronization.

FIG. 18 shows the four steps for generating the LA-FEC UI stream on the transmitter side.

Step one (1) of the LA-FEC UI process is the media encoding itself. The encoded stream could be either a layered media stream, e.g. with SVC or MVC, with n media layers with the base layer in layer 0 (payload data belonging to a first category) and the related enhancement layers in the higher layers (payload data belonging to a second category (and possible to a third category, a fourth category . . . )). Another meaningful setup could be having an audio stream in layer 0 and the related video stream in layer 1. The depicted example in FIG. 18 shows two layers, each with a different bitrate. The bitstream of a time period $\Delta t$ of each layer is divided into k source symbols, where due to the different bitrate in both layers $k_{layer0}=1$ and $k_{layer1}=2$. The source symbols contain the actual information and are the input for further FEC processing. Step one (1) may be regarded as a step of receiving payload data belonging to a/the first category and a step of receiving payload data belonging to a/the second category.

Step two (2) of the process is the LA-FEC process itself, e.g. based on an exemplary Raptor code like described in Section "Layer-Aware FEC". The illustration in FIG. 18 shows the FEC source blocks (SB) (payload data) and the parity symbols p (error correcting data) of both layers (i.e., first and second categories of payload data and associated error correcting data). In the example, the same code rate is applied to each layer with $CR=k/(k+p)=0.5$. Note that also an unequal code rate distribution can be applied. Following the LA-FEC process, the single parity symbol p in layer 0 (error correcting data for the first category payload data) is generated with the standard RaptorQ algorithm over the source symbols of layer 0 contained in the source blocks of layer 0, $SB0, \ldots, SB_3$. The $p=2$ parity symbols of layer 1 (error correcting data for the second category payload data) are generated over the extended source block across the source symbol of layer 0. Step two (2) may be regarded as a step of determining first error correcting data for the first category payload data and a step of determining second error correcting data for the second category payload data.

Step three (3) of the LA-FEC UI process is the unequal interleaving, which is represented in the example in FIG. 18 by a convolutional interleaver and an interleaving length of $IL_1=4$ (in the example, the interleaving length corresponds to the number of FEC source blocks) for layer 1 and no interleaving with $IL_0=1$ for layer 0. Note that any other kind of interleaver like e.g. block interleaver can be used for the LA-FEC UI process. In the outlined example, the interleaving process works on FEC symbols of fixed size. It is important to note here that the interleaving process can also be performed on packet level like e.g. UDP packets containing the encoded FEC source and parity symbols. Step three (3) may be regarded as a step of interleaving at least the second error correcting data (Layer 1 parity symbols) and the second category payload data (Layer 1 symbols) with each other, wherein a first interleaving length relative to an interleaving of the first error correcting data (Layer 0 parity symbol(s)) and the first category payload data (Layer 0 symbols) is different from a second interleaving relative to an interleaving of the second error correcting data and the second category payload data. In the illustrated example the first interleaving length is one, i.e. $IL_0=1$ which means that no active interleaving of the first error correcting data and the first category payload data is performed in this example. In general however, the first error correcting data may be interleaved with the first category payload data during an additional step of interleaving at least the first error correcting data and the first category payload data. Furthermore, the first error correcting data, the first category payload data, the second error correcting data, and the second category payload data may be interleaved in a combined interleaving step, wherein different first and second interleaving lengths are employed (this case is also covered by the formulation "interleaving at least the second error correcting data and the second category payload data").

Step four (4) of the LA-FEC UI denotes the delayed transmission of the layer with shorter interleaving for synchronization of both layers. Thus, the method for error correcting encoding may comprise an additional step of delaying a transmission of the interleaved first error correcting data and first category payload data. The length of the delay has to be set in a way that when all symbols of a certain source block in layer 0 (first category) have been received also all symbols of layer 1 (second category) of the corresponding source block have been received like shown in the FIG. 18. The length of the delay in symbols depends on the actual interleaving length of both layers and the number of symbols in the layer with the highest bitrate (layer 1, i.e. second category). Considering the exemplary interleaving in FIG. 18, the necessitated delay d for purpose of synchronization can be calculated by $d=(IL_1-IL_0)*(k_1+p_1)$.

The two bitstreams are furthermore transmitted separately or multiplexed over any kind of transmission channel. Note, that in the example we consider real time transmission, where both layers need to be presented at the receiver within a certain time frame and a transmission of a channel with burst erasures.

A corresponding error correcting encoder may comprise an error correcting data generator for receiving payload data belonging to a first category (first category payload data) and payload data belonging to a second category (second category payload data), and for determining first error correcting data for the first category payload data and second error correcting data for the second category payload data. The error correcting encoder may further comprise a second error correcting data generator for receiving payload data belonging to a second category and for determining second error correcting data for the second category payload data. Furthermore, an interleaver may be part of the error correcting encoder for interleaving at least the second error correcting data and the second category payload data with each other, wherein a first interleaving length relative to an interleaving of the first error correcting data and the first category payload data is different from a second interleaving length relative to an interleaving of the second error correcting data and the second category payload data.

In embodiments of the teachings disclosed herein, the error correcting data generator may comprise a first unit (i.e., a first error correcting data generator) and a second unit (i.e., a second error correcting data generator).

Figure 19A:
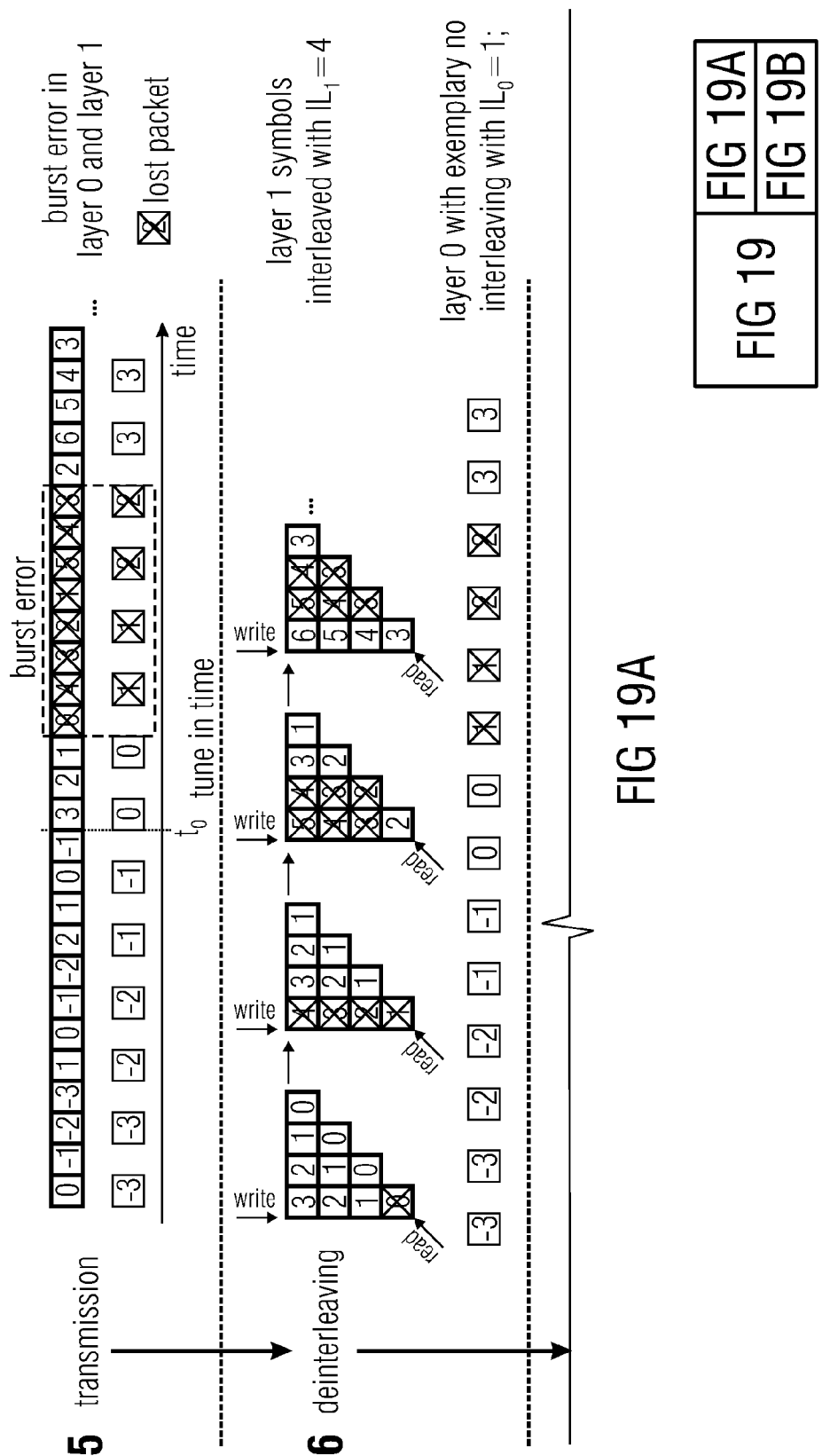
FIG. 19 schematically shows an example receiver processing including an exemplary burst error within the transmission, and includes FIGS. 19A and 19B.
Figure 19B:
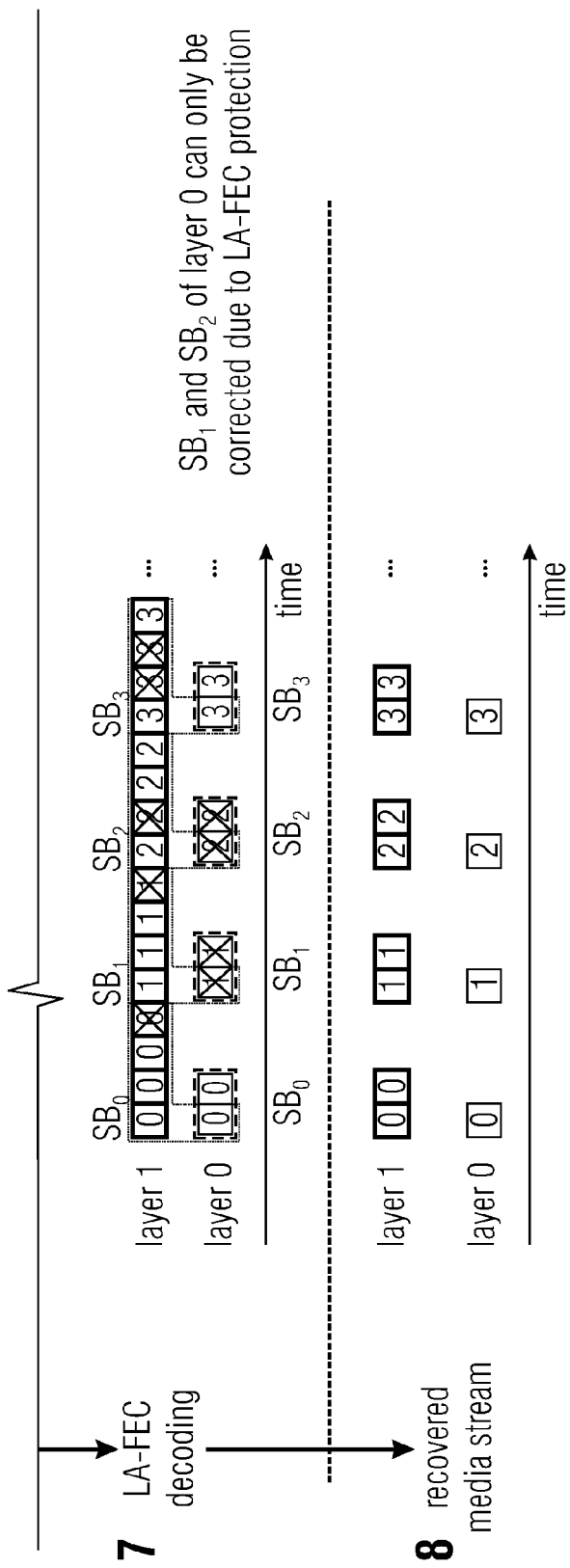

FIG. 19 shows an example receiver processing including an exemplary burst error within the transmission. In other words, FIG. 19 schematically illustrates the receiver side: Process of LA-FEC with unequal time interleaving with deinterleaving, LA-FEC decoding.

Step five (5) shows the transmission of the media stream generated in step (4) over an error prone channel. The transmission is affected by a burst error which affects both layers. The given example is outlined in an erasure channel just for the sake of simplicity, which is typically used to simulate transmission errors on link or application layer (see note in Section "Layer-Aware FEC"). However, the same process can also be applied in an error channel, where the position of errors is not known to the receiver like e.g. using the LA-FEC LDPC code described in Section "LA-FEC on physical channel with LDPC code". The burst error causes the loss of 4 packets (e.g., four bits/symbols) in layer 0 and eight packets (e.g. eight bits/symbols) in layer 1, where the number of lost packets depends on the actual bitrate of the layer. Lost packets are marked with a cross. It is assumed, that an exemplary receiver tunes into the media stream at time instance to. Note that a receiver can only make use of a fully received symbol or packet. If the tune is in the middle of a packet, the receiver cannot understand the packet due to the missing header and would discard it. If the header is fully received all necessitated information on the packet are available. In a method for error correcting decoding, step five (5) may be regarded as a step of receiving first category payload data and first error correcting data. The first category payload data may be interleaved with the first error correcting data in an interleaved data stream and the step of receiving the first category payload data and the first error correcting data may comprise receiving the interleaved data stream.

Step six (6) performs the deinterleaving of the received media stream (i.e., deinterleaving an interleaved data stream comprising (at least) second category payload data and second error correcting data). This necessitates the receiver to be aware of the actual interleaving time (interleaving length) of each layer $IL_0$ and $IL_1$. The interleaving lengths can be signaled by in band or out of band signaling.

Step seven (7) shows the FEC decoding. The standard FEC of layer 0 cannot correct SB1 and SB2 due to all packets got lost during transmission. Due to the LA-FEC concept, the enhancement layer (second category) protects the base layer (first category) and due to the longer time interleaving, there is only one packet lost in the enhancement layer. That is, there are enough packets received in the enhancement layer to fulfill equation (2) and (3) which allows correcting both layers in $SB_1$ and $SB_2$. In other words, step seven (7) corresponds to a step of correcting possible errors in the first category payload data using at least the first error correcting data, namely the first error correcting data and the second error correcting data. Furthermore, the second category payload data is corrected using at least the second error correcting data. The second category payload data may be further protected by additional error correcting data, for example third error correcting data belonging to a third category payload data (e.g., Layer 2, Layer 3, . . . ). The longer time interleaving of the enhancement layer compared to the interleaving of the base layer means that a first interleaving length relative to an interleaving of the first category payload data and the first error correcting data is different from a second interleaving length relative to the interleaving of the second category payload data and the second error correcting data.

Step eight (8) shows the recovered video stream without any errors due to the combination of LA-FEC and unequal time interleaving.

An error correcting decoder may comprise a de-interleaver and an error corrector. The de-interleaver may be configured to perform some or all actions of step six (6) described above. The error corrector may be configured to perform some or all actions of step seven (7) described above. In particular, the de-interleaver may be configured to de-interleave an interleaved data stream comprising payload data belonging to a second category and corresponding second error correcting data. Note that the interleaved data stream may further comprise payload data belonging to a first category and corresponding first error correcting data.

The first category payload data and the first error correcting data may be interleaved with the second category payload data and the second error correcting data. In the alternative, the first category payload data and/or the corresponding first error correcting data may be provided separately from the interleaved data stream comprising the second category payload data and second error correcting data. Moreover, the first category payload data and the first error correcting data may necessitate an actual interleaving/de-interleaving (interleaving length≠1) or may not necessitate an actual interleaving/de-interleaving (interleaving length=1). In other words, when no actual (active) interleaving/de-interleaving is performed (by an interleaver/de-interleaver), the resulting interleaving length is 1. A first interleaving length is relative to the first category payload data and the first error correcting data. A second interleaving length is relative to the second category payload data and the second error correcting data. The first interleaving length is different from the second interleaving length.

The error corrector may be configured to receive first category payload data and first error correcting data. Furthermore, the error corrector may be configured to receive the second category payload data and the second error correcting data in a de-interleaved form from the de-interleaver. Possible errors in the first category payload data may be corrected by the error corrector using at least the first error correcting data. Possible errors in the second category payload data may be corrected by the error corrector using at least the second error correcting data.

When a layer-aware forward error correction (LA-FEC) is implemented, the correaction of possible errors in the first category payload data (e.g., base layer data) may use the first error correcting data as well as the second error correcting data (e.g., the error correcting data of the enhancement layer). As explained above, the error correction of the first payload data may be made more reliable in this manner, typically at the expense of a reduced error correction capability of the second category payload data. Such an error correction scheme may be used in particular in cases in which the second category payload data (enhancement layer) depends on the first category payload data (base layer).

Figure 20:
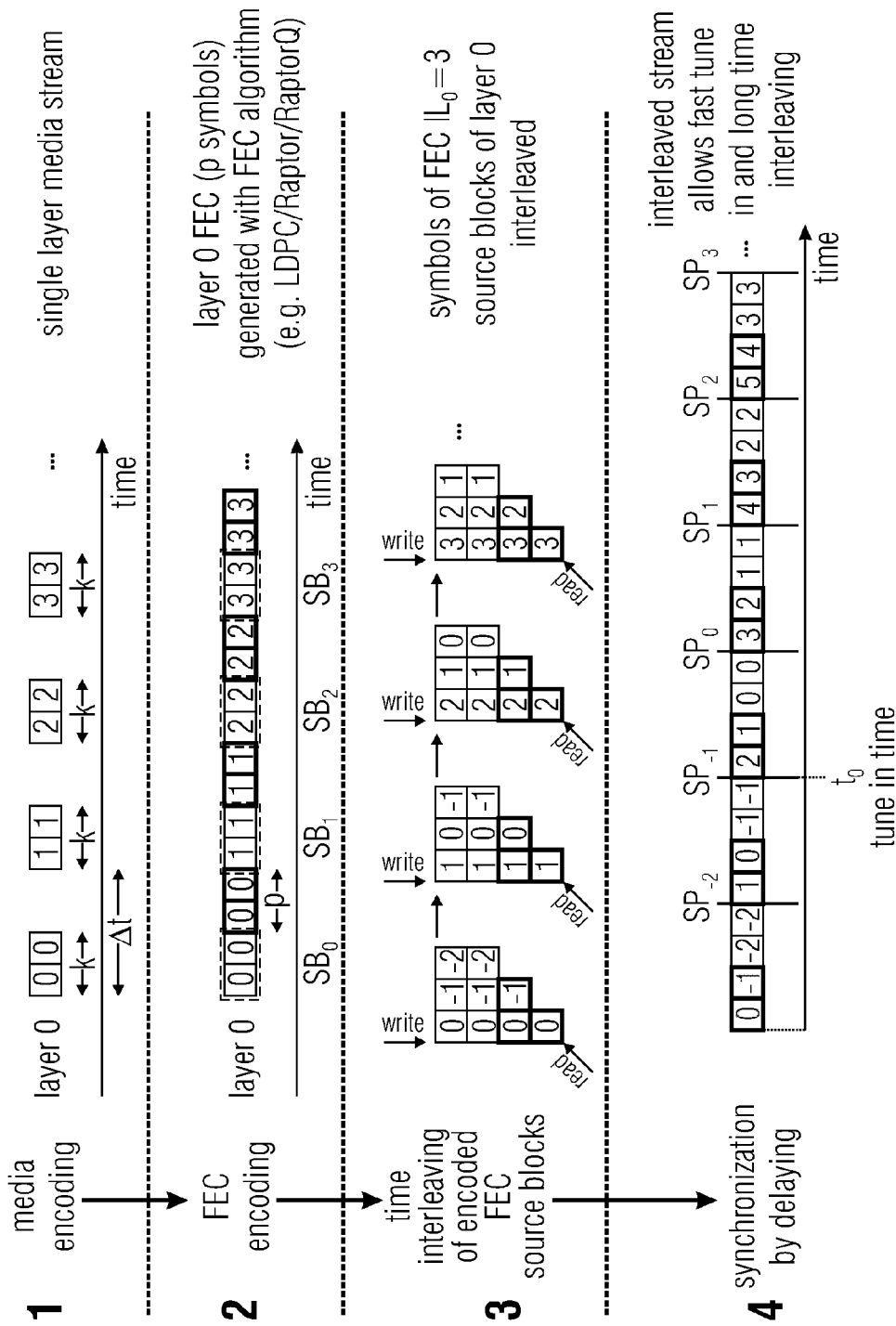
FIG. 20 schematically shows the process of FEC source block interleaving.

Fast zapping and longtime interleaving with single layer media and FEC source block interleaving:

A similar mechanism can be applied to single layer coding. FIG. 20 shows the process of FEC source block interleaving. In other words, FIG. 20 schematically illustrates the process of FEC source block interleaving for fast tune in and longtime interleaving.

Step one (1) shows the single layer (layer 0) media stream. Per time unit $\Delta t$ there are k source symbols. In the example k=2.

Step two (2) shows the FEC encoding with a FEC source block ($SB_x$) length of $\Delta t$ and p parity symbols. In the example p=2. The FEC algorithm can be for example a LDPC, Raptor, or RaptorQ code.

Step three (3) shows the interleaving of FEC source blocks, where the interleaving length $IL_0$ denotes the number of interleaved FEC source blocks. In the given example $IL_0$=3.

Step four (4) shows the final transmission scheduling with an exemplary tune in time $t_0$ and the related synchronization points ($SP_x$) of each source block ($SB_x$). A receiver, which tunes in at time instance to can start the video playout at $SP_0$. At this point it did not receive the other FEC symbols of SB0, so that the error correction capability is limited at this point. At $SP_1$, the receiver can decode SB1 with one additional parity symbol. While at $SP_2$ the full correction performance and time interleaving length has been received.

A corresponding error correcting encoder may comprise: an error correcting data generator for receiving payload data and determining error correcting data for the payload data; and an interleaver for interleaving the error correcting data and the payload data. The error correcting data precedes the payload data in an interleaved data stream. A payload interleaving length is different from an error correcting data interleaving length. One possible definition of the payload interleaving length is: the payload interleaving length describes a number of payload data items from one payload data block being inserted into a corresponding interleaved data block of the interleaved data stream. Likewise, the error correcting data interleaving length describes a number of error correcting data items resulting from said payload data block being inserted in a preceding interleaved data block. In the example of FIG. 20, the payload interleaving length is 1 (i.e., all payload symbols from one given source block are contained in a corresponding transmission block). The error correcting data interleaving length is three ($IL_{0,\ error\ correcting}$=3), because at least one error correcting symbol belonging to a certain source block is three transmission blocks away from the transmission block containing the corresponding payload symbol. For example, the transmission block starting at $t_0$ contains the two payload symbols "0" (white squares). The corresponding error correcting symbols (gray squares) are contained in the two preceding transmission blocks starting at $t_{-1}$ and $t_{-2}$ (not explicitly indicated in FIG. 20).

Optionally, all payload data items from said payload data block may be inserted in said interleaved data block, and the corresponding error correcting data items may be inserted in at least two interleaved data blocks directly or indirectly preceding said interleaved data block.

A corresponding method for error correcting encoding may comprise:
receiving payload data and determining error correcting data for the payload data;
interleaving the error correcting data and the payload data, wherein the error correcting data precedes the payload data in an interleaved data stream and wherein a payload interleaving length is different from an error correcting data interleaving length.

As far as the decoding side (e.g., a receiver side) is concerned, a corresponding error correcting decoder may comprise: a de-interleaver and an error corrector. The de-interleaver is configured for de-interleaving an interleaved data stream comprising payload data and error correction data for the fspayload data, wherein the error correcting data precedes the payload data in the interleaved data stream and wherein a payload interleaving length is different from an error correcting data interleaving length. The error corrector is configured for receiving the payload data and the error correcting data, and for correcting possible errors in the payload data using the error correcting data, wherein the payload is utilizable but possibly erroneous when only the payload data has been received and the error correcting data has been missed (for example due to late tune-in so that the error correcting data could not be captured anymore).

A corresponding method for error correcting decoding may comprise:
de-interleaving an interleaved data stream comprising payload data and error correction data for the payload data, wherein the error correcting data precedes the payload data in the interleaved data stream and wherein a payload interleaving length is different from an error correcting data interleaving length;
receiving the payload data and the error correcting data; and
correcting possible errors in the payload data using the error correcting data, wherein the payload is utilizable but possibly erroneous when only the payload data has been received and the error correcting data has been missed.

With such a transmission scheduling, a fast tune-in is possible while after interleaving period $IL_0$ the same correction performance and time diversity is achieved. Such a transmission scheduling can also be achieved without LA-FEC and necessitates a sophisticated deinterleaving mechanism on the receiver side.

Performance Examples for LA-FEC UI:

Simulation results are performed based on a Gilbert-Elliot model which simulates a fixed burst length. We assumes a fixed averaged burst length of 9.57 symbols and a varying average loss probability denoted by the erasure probability $p_{er}$.

SVC like simulations (spatial scalability e.g. 720p to 1080p):

Table 1 gives an overview on the selected configuration parameters. Note that this illustrative example assumes a certain symbol distribution across layers of 1:2 as it is typical for an SVC coded video stream and a fixed coderate per layer of 0.5. Further improvements compared to Single layer coding can be achieved by unequal code rate distributions across layers.

TABLE 1

Media stream and FEC coding parameters:

|  | Single layer | Layered-Media |
|---|---|---|
| Source Symbols per FEC Source Block k | 60 | Layer 0: 20<br>Layer 1: 40<br>(Typical distribution of spatial scalability in SVC) |
| FEC Code-rate CR = k/n | 0.5 | Layer 0: 0.5<br>Layer 1: 0.5 |
| Number of coded symbols (source + parity) n | 120 | Layer 0: 40<br>Layer 1: 80<br>Total: 120 |
| Interleaving length | 1; 9 | Layer 0: 1<br>Layer 1: 1; 9 |
| PSNR | 40 dB<br>15 dB (not decodable) | Layer 0: 30 dB<br>Layer 1: 40 dB<br>15 dB<br>(not decodable) |

Figure 21:
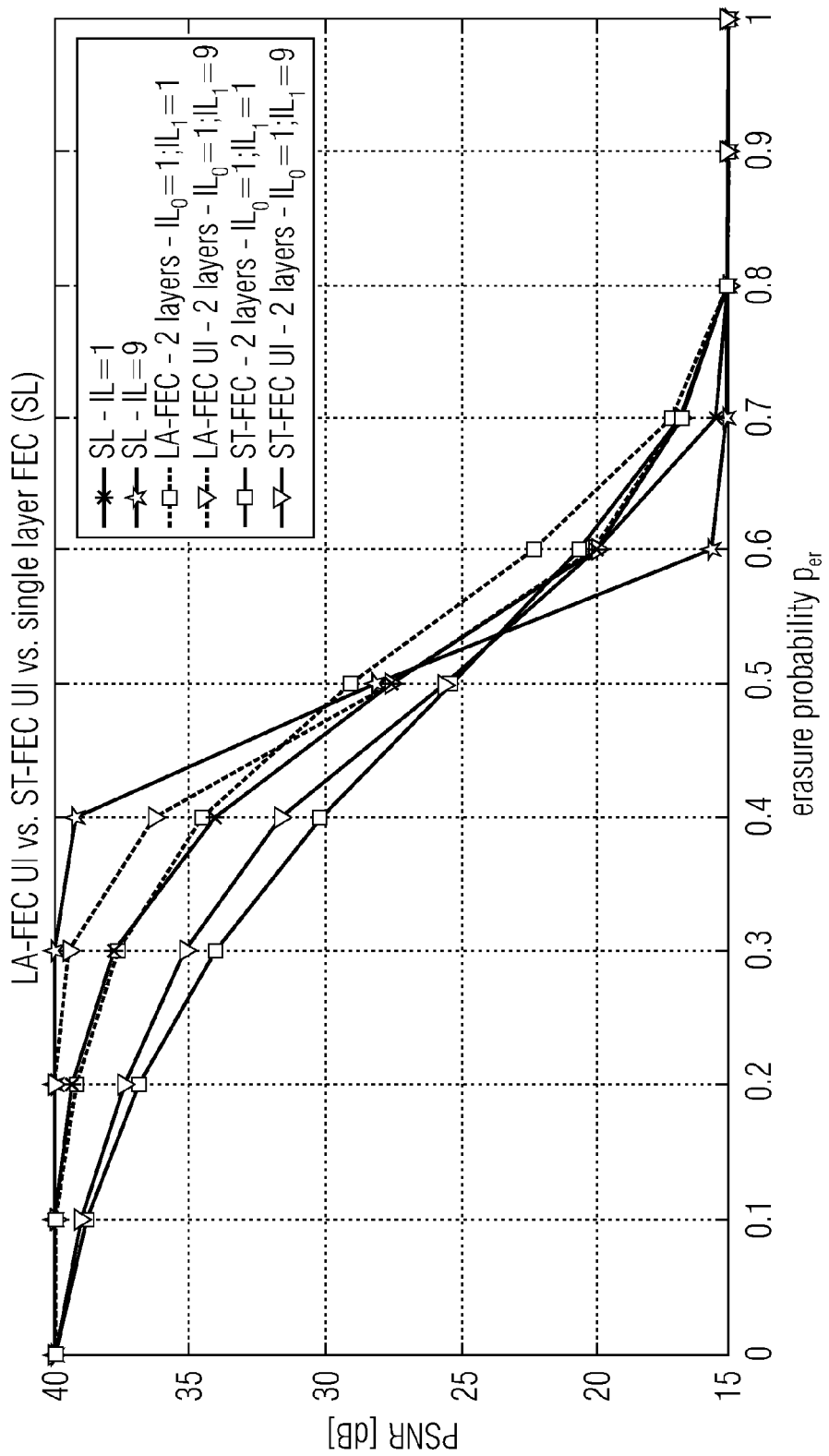
FIG. 21 schematically shows the received video quality in terms of PSNR over a certain erasure probability per for the single layer case, standard FEC with FEC generation independently for each layer (ST-FEC), and the LA-FEC UI with different interleaving length is shown FIGS. 22A and 22B schematically show the layer decoding probability of the base layer (FIG. 22A) and of the enhancement layer (FIG. 22B)

The received video quality in terms of PSNR over a certain erasure probability per for the single layer case, standard FEC with FEC generation independently for each layer (ST-FEC), and the LA-FEC UI with different interleaving length is shown in FIG. 21 and the layer decoding probability of the base layer is shown in FIG. 22 to highlight the difference on base layer decoding probability with ST-FEC UI and LA-FEC UI. Note that the single layer case with interleaving length IL=9 does not provide the same tune in time like the other schemes and is only included to denote the potential performance of a single layer FEC source block interleaving.

FIG. 21 shows a comparison of video quality in terms of PSNR with LA-FEC, LA-FEC UI, ST-FEC, ST-FEC UI, and single layer (SL) coding. Two different interleaving length IL=1 (no interleaving) and IL=9 are used. Note that only SL-IL=1 shows the same tune in time like all LA-FEC UI schemes. The results in FIG. 21 show, that LA-FEC $IL_0$=1; $IL_1$=1 without UI outperforms the ST-FEC schemes and approaches the SL scheme. IL=1 performance. LA-FEC UI FEC $IL_0$=1; $IL_1$=9 significantly outperforms the single layer FEC coding that provides the same tune in delay SL-IL=1. LA-FEC UI does not reach the single layer IL=9 performance. That is, the LA-FEC UI scheme provides a performance between SL-IL1 and SL-IL9 while allowing a fast tune in into the service.

Figure 22A:
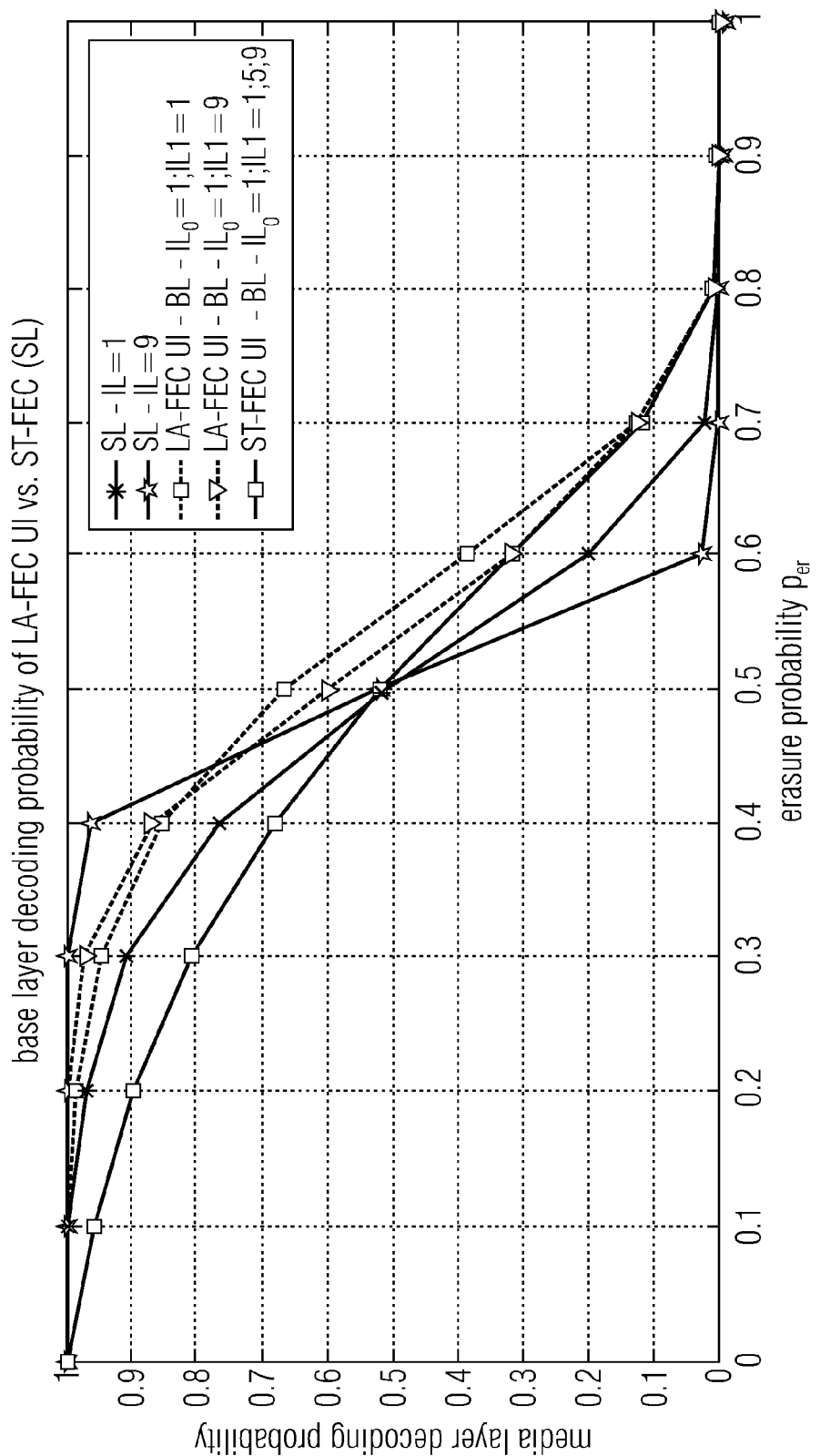
Figure 22B:
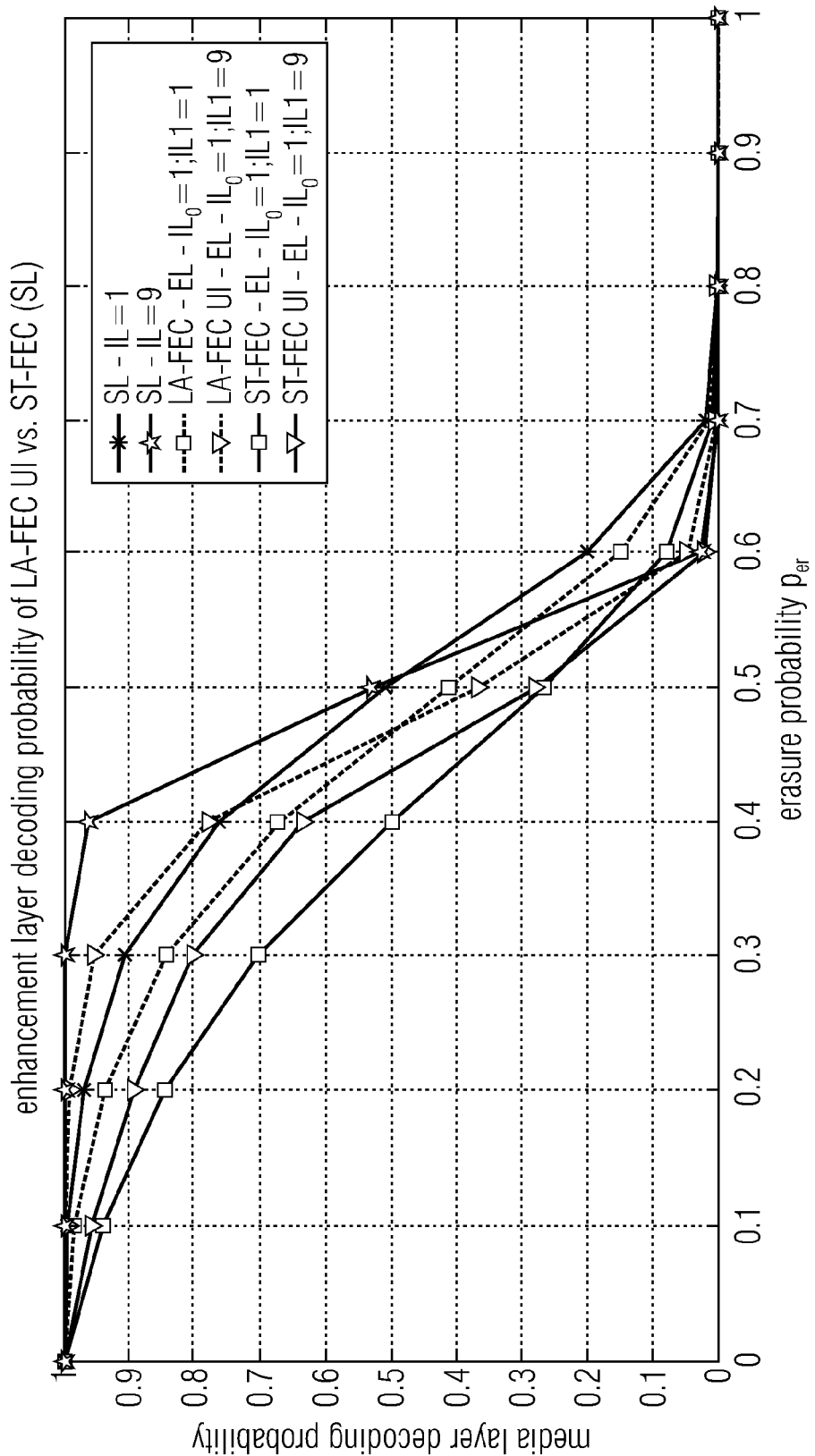

FIGS. 22A and 22B show a comparison of base layer and enhancement layer decoding LA-FEC, LA-FEC UI, ST-FEC, ST-FEC UI, and single layer (SL) coding. Two different interleaving length IL=1 (no interleaving) and IL=9 are used. Note that only SL-IL=1 shows the same tune-in time like all LA-FEC UI schemes. The impact of the LA-FEC UI scheme on the base layer performance can be seen in FIG. 22A. Contrary to ST-FEC UI, where the longer interleaving of the enhancement layer does not have any impact on the base layer, with LA-FEC; the base layer performance is increased. Overall, the results show the performance gain of LA-FEC UI when compared to schemes with same service tune in (zapping) time. Further gain is expected with optimization of code rate distribution across layers (UEP) and with another ratio of source symbol distribution across layers.

LA-FEC UI with Audio Stream as Layer 0 and Video Stream as Layer 1:

It is important to note that the proposed LA-FEC UI scheme can also be applied to single layer video across e.g. audio stream. These sections give some performance results with having an audio stream in layer 0 and a video stream in layer 1.

Table 2 gives an overview on the selected configuration parameters. Note that this illustrative example assumes a certain symbol distribution across the two layers of 1:8 as it could be realistic for an audio coded stream in comparison to a video stream. Furthermore, a fixed coderate per layer of 0.5 is assumed. Further improvements compared to Single layer coding can be achieved by unequal code rate distributions across layers.

TABLE 2

Media stream and FEC coding parameters:

|  | Single layer | Layered-Media |
|---|---|---|
| Source Symbols per FEC Source Block k | 60 | Layer 0: 7<br>Layer 1: 54<br>(Assumed bitrate distribution of audio (layer 0) and video (layer 1) |
| FEC Code-rate CR = k/n | 0.5 | Layer 0: 0.5<br>Layer 1: 0.5 |
| Number of coded symbols (source + parity) n | 120 | Layer 0: 14<br>Layer 1: 106<br>Total: 120 |
| Interleaving length | 1; 9 | Layer 0: 1<br>Layer 1: 1; 9 |

Figure 23:
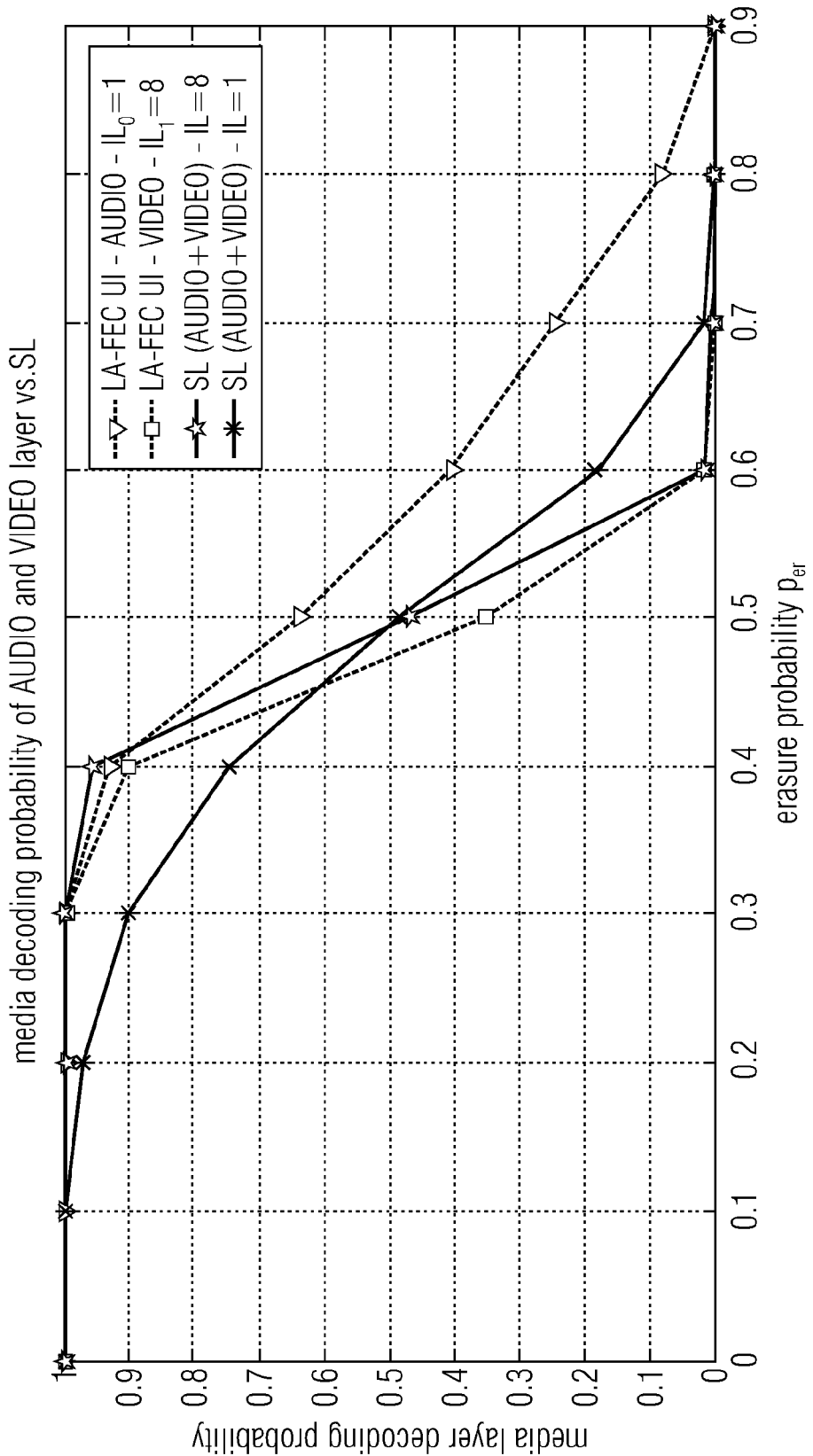
FIG. 23 schematically shows a comparison in terms of media decoding probability with having both, audio and video, within one FEC source block referred to as single layer (SL) with an interleaving length of 1 and 8.

The results in FIG. 23 denote the setting with an audio stream in layer 0 and a video stream in layer 1 with a bitrate ratio across layers of 1:8. The Figure shows a comparison in terms of media decoding probability with having both, audio and video, within one FEC source block referred to as single layer (SL) with an interleaving length of 1 and 8. In other words, FIG. 23 shows a comparison of audio and video layer decoding with LA-FEC UI, and single layer (SL) coding. Two different interleaving length IL=1 (no interleaving) and IL=9 are used. Note that only SL-IL=1 shows the same tune in time like all LA-FEC UI schemes.

The results in FIG. 23 show, that with a larger difference between the bitrates of the two layers, the gain of LA-FEC UI also increases. While the LA-FEC UI VIDEO coding layer almost reaches the performance of the SL setting, the LA-FEC UI AUDIO stream even outperforms the SL stream due to the small source block of the audio stream is beneficial in higher error regions of an error burst channel.

Signaling of Raptor and RaptorQ and LA-FEC UI:

Raptor and RaptorQ necessitates an out-of-band or in-band signaling of the amount of source symbols k (in-band) and Kmax (SDP), the symbol size T, the unique identifier of each encoded symbol X (contained in the Raptor Payload ID in IETF FEC Framework), and the used FEC algorithm defined in the example by the encoding ID (SDP) and the FEC ID (in-band) for reproducing the precoding and encoding matrix at the receiver side (cf. Section "Layer-Aware FEC integration into Raptor FEC" and Section "Layer-Aware FEC integration into RaptorQ FEC").

LA-FEC necessitates the signaling of the enhancement layer symbols and base layer symbols can be used in a joint decoding process (cf. Section "Signaling of LA-FEC").

For an efficient memory management of the deinterleaving process at the receiver side, the LA-FEC UI Raptor or RaptorQ necessitates in addition the signaling of the interleaving length (IL) of the FEC coded symbols of all involved layers (cf. Section "Time interleaving").

An exemplary out of band signaling using SDP (cf. Section "Signaling of LA-FEC") is shown in the following by a potential new parameter <<a:fec.interleaving:200 ms>>

```
v=0
o=Cornelius 1122334455 1122334466 IN IP4 la-fec.example.com
s=SVC LA-FEC Raptor Example
t=0 0
a=group:FEC-FR S1 S2 R1 R2
a=group:FEC-FR S1 R1
c=IN IP4 233.252.0.1/127
a=group:DDP S1 S2
m=video 20000 RTP/AVP 96
b=AS:90
a=framerate:15
a=rtpmap:96 H264/90000
a=fec-source-flow: id=0
a=mid:S1
m=video 20002 RTP/AVP 97
b=AS:64
a=framerate:15
a=rtpmap:97 H264-SVC/90000
a=fec-source-flow: id=1
a=mid:S2
a=depend:97 lay S1: 97
m=application 30000 RTP/AVP 110
c=IN IP4 233.252.0.3/127
a=fec-repair-flow: encoding-id=6; fssi=Kmax:8192,T:128,P:A;
a=fec-interleaving: 200ms
a=mid:R1
m=application 30000 RTP/AVP 111
c=IN IP4 233.252.0.4/127
a=fec-repair-flow: encoding-id=6; fssi=Kmax:8192,T:128,P:A
a=fec-interleaving: 1000ms
a=mid:R2
```

Figure 24:
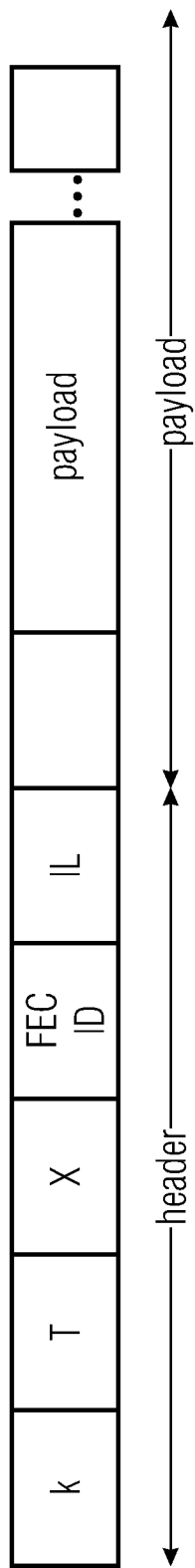
FIG. 24 schematically illustrates an exemplary inband signaling of interleaving length (IL) with number of source symbols k, source symbol size T, unique symbol identifier (FEC ID) and the interleaving length (IL) of the actual source block.

Another possibility is to do an inband signaling with a packet header like described in FIG. 24 which schematically illustrates exemplary inband signaling of interleaving length (IL) with number of source symbols k, source symbol size T, unique symbol identifier (FEC ID) and the interleaving length (IL) of the actual source block. The IL value corresponds to the a=fec-interleaving parameter in the SDP example.

Progress Beyond State of the Art:
  Unequal time interleaving and LA-FEC bring together fast zapping (service tune in) and longtime interleaving. A base layer with short time interleaving allows fast tune in. The enhancement layer has a long time interleaving that protects the base layer due to LA-FEC.
  A receiver that tunes into the service first starts decoding the base layer. After a transition period it can decode the enhancement layer. Due to LA-FEC, the whole service robustness is increased by the longer time interleaving of the enhancement layer.
  The transmission scheduling of both layers is scheduled in a way that the base layer transmission is delayed to keep base and enhancement layer with unequal time interleaving length synchronized.
  Interleaving of FEC source blocks with single layer and layered media coding
  Signaling of interleaving length of the FEC source block of each layer at receiver side.
  LA-FEC can also be applied to single layer over any synchronized data, e.g. single layer and its associated audio stream. This is not considered in existing LA-FEC patent application US2010/017686 A1.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The inventive encoded/compressed signals can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[1] A. Shokrollahi, "Raptor Codes," IEEE Transactions on Information Theory, Vol. 52, Issue 6, pp. 2551-2567, 2006.
[2] M. Luby, A. Shokrollahi, M. Watson, T. Stockhammer, L. Minder, "RaptorQ Forward Error Correction Scheme for Object Delivery," IETF RMT, draft-ietf-rmt-bb-fec-raptorq-04, August 2010, http://tools.ietf.org/html/draft-ietf-rmt-bb-fec-raptorq-04.
[3] M. Luby, A. Shokrollahi, M. Watson, T. Stockhammer, "Raptor Forward Error Correction Scheme for Object Delivery," IETF RFC 5053, Internet Engineering Task Force (IETF), Network Working Group, September 2007, http://tools.ietf.org/html/rfc5053.
[4] C. Hellge, T. Schierl, and T. Wiegand, "Mobile TV using scalable video voding and layer-aware forward error correction," IEEE International Conference on Multimedia and Expo (ICME'08), Hanover, Germany, June 2008.
[5] Cornelius Hellge, David Gomez-Barquero, Thomas Schierl, and Thomas Wiegand: Layer-Aware Forward Error Correction for Mobile Broadcast of Layered Media, *IEEE Transactions on Multimedia*, vol. 13, pp. 551-562, 2011.
[6] H. Schulzrinne, S. Casner, R. Frederick, and V. Jacobson, "RTP: A Transport Protocol for Real-time Applications", IETF STD 0064, RFC 3550, July 2003, http://tools.ietf.org/html/rfc3550.
[7] J. Postel, "User Datagram Protocol", IETF STD 6, RFC 768, September 1981, http://tools.ietf.org/html/rfc768.
[8] S. Wenger, Y.-K. Wang, T. Schierl, and A. Eleftheriadis, "RTP payload format for SVC video", IETF AVT, RFC 6190, May 2011, http://tools.ietf.org/html/rfc6190.
[9] Y.-K. Wang, T. Schierl, "RTP Payload Format for MVC Video," work in progress, IETF AVT, draft-ietf-payload-rtp-mvc-01.txt, September 2011, http://tools.ietforg/html/draftietf-payload-rtp-mvc-01.
[10] M. Handly, V. Jacobson, and C. Perkins, "SDP: Session Description Protocol", IETF RFC 4566, July 2006, http://tools.ietf.org/html/rfc4566.
[11] T. Schierl and S. Wenger, "Signaling media decoding dependency in Session Description Protocol (SDP)," IETF MMUSIC, April 2009, http://tools.ietf.org/html/rfc5583.
[12] M. Watson, A. Begen, V. Roca, "Forward Error Correction (FEC) Framework," IETF FECFRAME, RFC 6363, October 2011.
[13] M. Watson, T. Stockhammer, M. Luby, "Raptor FEC Schemes for FECFRAME," IETF FECFRAME, draft-ietf-fecframe-raptor-05, September 2011, http://tools.ietf.org/html/draft-ietf-fecframe-raptor-05.
[14] M. Watson, T. Stockhammer, "RTP Payload Format for Raptor FEC", IETF FECFRAME, draft-ietf-fecframe-rtp-raptor-05, October 2011, http://tools.ietf.org/html/draft-ietf-fecframe-rtp-raptor-05.
[15] A. Begen, "Session Description Protocol Elements for the Forward Error Correction (FEC) Framework", IETF FECFRAME, RFC 6364, October 2011, http://tools.ietf.org/html/rfc6364.
[16] A. Begen, "Forward Error Correction Grouping Semantics in the Session Description Protocol", IETF FECFRAME, RFC 5956, September 2010, http://tools.ietf.org/html/rfc5956.
[17] G. Camarillo, H. Schulzrinne, "The Session Description Protocol (SDP) Grouping Framework," IETF MMUSIC, RFC 5888, June 2010, http://tools.ietf.org/html/rfc5888.
[18] Patent Application LA-FEC (Publication No. US 2010/017686 A1)

The invention claimed is:

1. An error correcting encoder comprising:
an error correcting data generator that receives payload data belonging to a first category (first category payload data), that receives payload data belonging to a second category (second category payload data), that determines first error correcting data for the first category payload data, and that determines second error correcting data for the second category payload data; and
an interleaver that interleaves at least the second error correcting data and the second category payload data with each other, wherein a first interleaving length relative to an interleaving of the first error correcting data and the first category payload data is different from a second interleaving length relative to the interleaving of the second error correcting data and the second category payload data; wherein
the first category payload data corresponds to a base layer and the second category payload data corresponds to an enhancement layer of a scalable video coding (SVC) scheme or a multiview video coding (MVC) scheme;
the error correcting data generator receives the first category payload data and determines the second error correcting data based on the first category payload data and the second category payload data so that a decoder-side error correction of the first category payload data using the first error correcting data and the second error correcting data, improves an error correction performance for the first category payload data compared to using the first error correcting data only; and
the error correcting encoder further comprises a delay that delays the first category payload data and the first error correcting data so that when all symbols of a first source block of the first category have been received, also all source symbols of the second category of a second source block corresponding to the first source block have been received.

2. The error correcting encoder according to claim 1, wherein the first interleaving length is different from the second interleaving length so that the first category payload data is reconstructible from a relatively short section of an interleaved data stream comprising the first category payload data and the first error correcting data, and that the second category payload data is reconstructible from a relatively longer section of the interleaved data stream or another interleaved data stream comprising the second category payload data and the second error correcting data so that the second category payload data and the second error correcting data are relatively robust with respect to one or more data errors affecting a relatively short section of the interleaved data stream comprising the second category payload data and the second error correcting data.

3. The error correcting encoder according to claim 1, wherein the first category payload data and the second category payload data are interrelated via a dependency relation.

4. The error correcting encoder according to claim 1, wherein the first category payload data is part of a first description of a multiple description coding (MDC) of a payload content, and wherein the second category payload data is part of a second description of the multiple description coding of the payload content.

5. The error correcting encoder according to claim 1, wherein the error correcting data generator is configured for performing a layer-aware forward error correction (LA-FEC).

6. The error correcting encoder according to claim 1, further comprising a multiplexer for multiplexing at least the first category payload data, the first error correcting data, the second category payload data, and the second error correcting data to form a multiplexed data stream.

7. The error correcting encoder according to claim 1, further comprising a signaling component for transmitting an interleaving length information regarding at least one of the first interleaving length and the second interleaving length to a decoder side.

8. An error correcting decoder comprising:
a de-interleaver that de-interleaves an interleaved data stream including second category payload data and second error correcting data; and
an error corrector that receives first category payload data, first error correcting data, the second category payload data, and the second error correcting data in an de-interleaved form from the de-interleaver, that corrects possible errors in the first category payload data using at least the first error correcting data, and that corrects possible errors in the second category payload data using at least the second error correcting data; wherein
a first interleaving length relative to an interleaving of the first category payload data and the first error correcting data is different from a second interleaving length relative to the interleaving of the second category payload data and the second error correcting data;
the first category payload data corresponds to a base layer and the second category payload data corresponds to an enhancement layer of a scalable video coding (SVC) scheme or a multiview video coding (MVC) scheme;
the error corrector uses the second error correcting data to correct the possible errors in the first category payload data, when an encoder-side error correction encoding has determined the second error correcting data based on the first category payload data and the second category payload data; and
the first category payload data and the first error correcting data are delayed so that when all source symbols of a first source block of the first category have been received, also all source symbols of a second source block of the second category corresponding to the first source block have been received.

9. The error correcting decoder according to claim 8, wherein the first interleaving length is different from the second interleaving length so that the first category payload data is reconstructible from a relatively short section of an interleaved data stream comprising the first category payload data and the first error correcting data, and that the second category payload data is reconstructible from a relatively longer section of the interleaved data stream or an interleaved data stream comprising the second category payload data and the second error correcting data, so that the second category payload data and the second error correcting data are relatively robust with respect to errors affecting a relatively short section of the interleaved data stream comprising the second category payload data and the second error correcting data.

10. The error correcting decoder according to claim 8, wherein the first category payload data and the second category payload data are interrelated via a dependency relation.

11. The error correcting decoder according to claim 8, wherein the first category payload data is part of a first description of a multiple description coding (MDC) of a payload content and the second category payload data is part of a second description of the multiple description coding of the payload content.

12. The error correcting decoder according to claim 8, wherein the first category payload data comprises audio data and wherein the second category payload data comprises video data.

13. The error correcting decoder according to claim 8, wherein the error corrector is configured for performing a layer-aware forward error correction (LA-FEC).

14. The error correcting decoder according to claim 8, further comprising a demultiplexer for demultiplexing a multiplexed data stream comprising the first category payload data, the first error correcting data, and the interleaved second category payload data and second error correcting data.

15. The error correcting decoder according to claim 8, further comprising a signaling component for receiving an interleaving length information regarding at least one of the first interleaving length and the second interleaving length from an encoder side.

16. A method for error correcting encoding comprising:
receiving payload data belonging to a first category;
receiving payload data belonging to a second category;
determining first error correcting data for the first category payload data;
determining second error correcting data for the second category payload data; and
interleaving at least the second error correcting data and the second category payload data with each other, wherein a first interleaving length relative to an interleaving of the first error correcting data and the first category payload data is different from a second interleaving relative to an interleaving of the second error correcting data and the second category payload data; wherein
the first category payload data corresponds to a base layer and the second category payload data corresponds to an enhancement layer of a scalable video coding (SVC) scheme or a multiview video coding (MVC) scheme;
the second error correcting data is determined based on the first category payload data and the second category payload data so that a decoder-side error correction of the first category payload data using the first error correcting data and the second error correcting data, improves an error correction performance for the first category payload data compared to using the first error correcting data only;
the first category payload data and the first error correcting data are delayed so that when all source symbols of a first source block of the first category have been received, also all source symbols of a second source block of the second category corresponding to the first source block have been received; and the method is performed by a computer or an electronic circuit.

17. The method according to claim 16, wherein the first interleaving length is different from the second interleaving length so that the first category payload data is reconstructible from a relatively short section of an interleaved data stream comprising the first category payload data and the first error correcting data, and that the second category payload data is reconstructible from a relatively longer section of the interleaved data stream or another interleaved data stream comprising the second category payload data and the second error correcting data so that the second category payload data and the second error correcting data are relatively robust with respect to one or more data errors affecting a relatively short section of the interleaved data stream comprising the second category payload data and the second error correcting data.

18. The method according to claim 16, wherein the first category payload data and the second category payload data are interrelated via a dependency relation.

19. The method according to claim 16, wherein the first category payload data is part of a first description of a multiple description coding (MDC) of a payload content, and wherein the second category payload data is part of a second description of the multiple description coding of the payload content.

20. The method according to claim 16, wherein the first category payload data corresponds to a base layer and the second category payload data corresponds to an enhancement layer of a scalable video coding (SVC) or a multiview video coding (MVC) scheme.

21. The method according to claim 16, wherein the first category payload data comprises audio data and the second category payload data comprises video data.

22. The method according to claim 16, wherein the error correcting data generator is configured for performing a layer-aware forward error correction (LA-FEC).

23. A method for error correcting decoding comprising:
receiving an interleaved data stream comprising second category payload data and second error correcting data;
de-interleaving the interleaved data stream;
receiving or acquiring first category payload data and first error correcting data;
correcting possible errors in the first category payload data using at least the first error correcting data; and
correcting possible errors in the second category payload data using at least the second error correcting data; wherein
a first interleaving length relative to an interleaving of the first category payload data and first error correcting data is different from a second interleaving length relative to the interleaving of the second category payload data and the second error correcting data;
the first category payload data corresponds to a base layer and the second category payload data corresponds to an enhancement layer of a scalable video coding (SVC) scheme or a multiview video coding (MVC) scheme;
the second error correcting data is used to correct the possible errors in the first category payload data, wherein an encoder-side error correction encoding has determined the second error correcting data based on the first category payload data and the second category payload data; and
the first category payload data and the first error correcting data are delayed so that when all source symbols of a first source block of the first category have been received, also all source symbols of a second source block of the second category corresponding to the first source block have been received; and the method is performed by a computer or an electronic circuit.

24. A non-transitory computer readable digital storage medium having stored thereon a computer program comprising a program code for performing, when running on a computer, a method for error correcting encoding comprising:
receiving payload data belonging to a first category;
receiving payload data belonging to a second category;
determining first error correcting data for the first category payload data;
determining second error correcting data for the second category payload data; and
interleaving at least the second error correcting data and the second category payload data with each other, wherein a first interleaving length relative to an interleaving of the first error correcting data and the first category payload data is different from a second interleaving relative to an interleaving of the second error correcting data and the second category payload data; wherein
the first category payload data corresponds to a base layer and the second category payload data corresponds to an enhancement layer of a scalable video coding (SVC) scheme or a multiview video coding (MVC) scheme;
the second error correcting data is determined based on the first category payload data and the second category payload data so that a decoder-side error correction of the first category payload data using the first error correcting data and the second error correcting data, improves an error correction performance for the first category payload data compared to using the first error correcting data only; and
the first category payload data and the first error correcting data are delayed so that when all source symbols of a first source block of the first category have been received, also all source symbols of a second source block of the second category corresponding to the first source block have been received.

25. A non-transitory computer readable digital storage medium having stored thereon a computer program comprising a program code for performing, when running on a computer, a method for error correcting decoding comprising:
receiving an interleaved data stream comprising second category payload data and second error correcting data;
de-interleaving the interleaved data stream;
correcting possible errors in the first category payload data using at least the first error correcting data; and
correcting possible errors in the second category payload data using at least the second error correcting data; wherein
a first interleaving length relative to an interleaving of the first category payload data and first error correcting data is different from a second interleaving length relative to the interleaving of the second category payload data and the second error correcting data;
the first category payload data corresponds to a base layer and the second category payload data corresponds to an enhancement layer of a scalable video coding (SVC) scheme or a multiview video coding (MVC) scheme, and the second error correcting data is used to correct the possible errors in the first category payload data, wherein an encoder-side error correction encoding has determined the second error correcting data based on the first category payload data and the second category payload data; and the first category payload data and the first error correcting data are delayed so that when all source symbols of a first source block of the first category have been received, also all source symbols of a second source block of the second category corresponding to the first source block have been received.

* * * * *